(12) United States Patent
Hara

(10) Patent No.: US 8,274,854 B2
(45) Date of Patent: Sep. 25, 2012

(54) SEMICONDUCTOR STORAGE DEVICE AND METHOD FOR PRODUCING SEMICONDUCTOR STORAGE DEVICE

(75) Inventor: Kota Hara, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/330,456

(22) Filed: Dec. 19, 2011

(65) Prior Publication Data

US 2012/0087195 A1    Apr. 12, 2012

Related U.S. Application Data

(62) Division of application No. 12/360,621, filed on Jan. 27, 2009, now Pat. No. 8,107,314.

(30) Foreign Application Priority Data

Jan. 30, 2008   (JP) ................................ 2008-019316

(51) Int. Cl.
*G11C 7/00* (2006.01)
(52) U.S. Cl. ................ 365/201; 365/233.1; 365/233.19
(58) Field of Classification Search ................ 365/201, 365/233.1, 233.19
See application file for complete search history.

(56) References Cited

U.S. PATENT DOCUMENTS

| | | | |
|---|---|---|---|
| 6,295,243 B1 | 9/2001 | Otsuka et al. | |
| 6,404,684 B2 * | 6/2002 | Arimoto et al. | 365/189.18 |
| 6,654,299 B2 | 11/2003 | Otsuka et al. | |
| 6,711,075 B2 * | 3/2004 | Saitoh et al. | 365/201 |
| 6,778,451 B2 | 8/2004 | Takahashi et al. | |
| 7,023,748 B2 | 4/2006 | Matsumoto | |
| 7,190,627 B2 | 3/2007 | Sato | |
| 7,200,059 B2 * | 4/2007 | Fujioka et al. | 365/201 |
| 7,366,965 B2 * | 4/2008 | Yamasaki et al. | 714/718 |

FOREIGN PATENT DOCUMENTS

| | | |
|---|---|---|
| JP | 11-306796 A | 11/1999 |
| JP | 2000-163997 A | 6/2000 |
| JP | 2003-151299 A | 5/2003 |

* cited by examiner

*Primary Examiner* — Son Dinh
(74) *Attorney, Agent, or Firm* — Arent Fox LLP

(57) ABSTRACT

A semiconductor storage device comprises a timing control circuit that generates a signal for controlling at least one of a read operation and a write operation; an input-signal pad; a plurality of control-signal pads; and a switch circuit coupled to at least one of the plurality of control-signal pads. The switch circuit generates a first control signal to be supplied to the timing control circuit based on a signal from the input-signal pad in a first mode.

4 Claims, 21 Drawing Sheets

FIG. 5

| | CE2 | /CE1 | /WE | /OE | /UB | /LB | CLK | A00 | A01 | A02 | A03 | A04 | A05 | A06 |
|---|---|---|---|---|---|---|---|---|---|---|---|---|---|---|
| TEST-A | H | L | L | L | X | X | X | H | L | L | L | L | L | L |
| TEST-B | H | L | L | L | X | X | X | H | H | H | H | H | H | L |
| TEST-C | H | L | L | L | X | X | X | H | H | H | L | H | H | L |
| TEST-D | H | L | L | L | X | X | X | H | H | H | H | H | L | L |
| TEST-E | H | L | L | L | X | X | X | H | H | L | H | L | H | H |
| TEST-F | H | L | L | L | X | X | X | H | H | L | L | L | H | H |
| TEST-G | H | L | L | L | X | X | X | H | H | H | H | L | L | H |

X: Don't care

FIG. 6

| | TEST1 | TEST2 | TEST3 | TEST4 | TEST5 | TEST6 | UBint | LBint | CLKint |
|---|---|---|---|---|---|---|---|---|---|
| TEST-A | L | L | L | L | L | L | =/UB | =/UB | =CLK |
| TEST-B | H | H | H | H | H | L | =A09 | =A09 | Disable |
| TEST-C | H | H | L | H | H | L | H | =A09 | Disable |
| TEST-D | H | H | H | H | L | L | =A09 | H | Disable |
| TEST-E | H | L | H | L | H | H | L | L | =A09 |
| TEST-F | H | L | L | L | H | H | H | L | =A09 |
| TEST-G | H | H | H | L | L | H | L | H | =A09 |

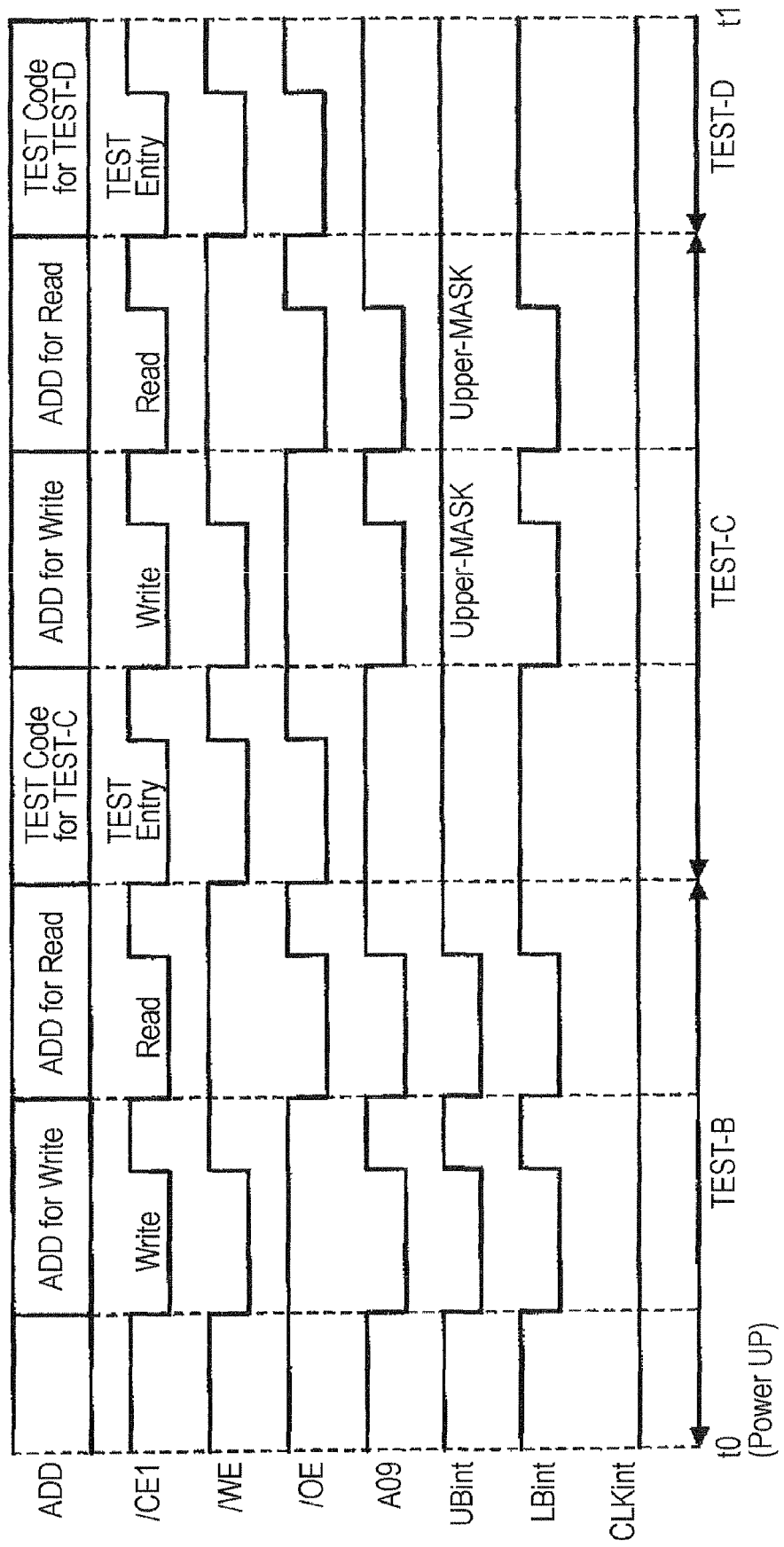

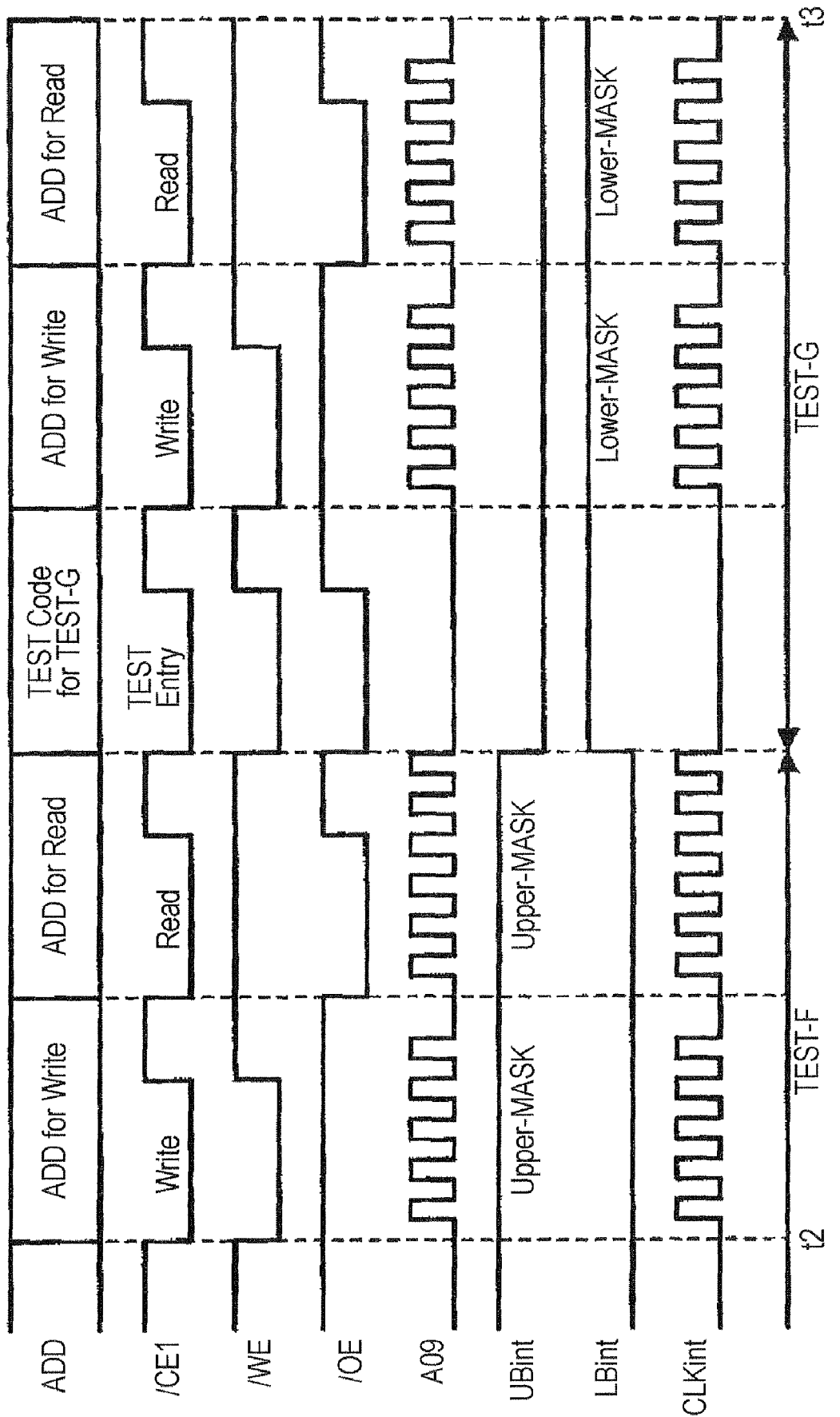

FIG. 13

| | CE2 | /CE1 | /WE | /OE | /UB | /LB | CLK | A00 | A01 | A02 | A03 | A04 | A05 | A06 |
|---|---|---|---|---|---|---|---|---|---|---|---|---|---|---|
| TEST-A | H | L | L | L | X | X | X | H | L | L | L | L | X | X |
| TEST-B | H | L | L | L | X | X | X | H | H | H | H | L | X | X |
| TEST-C | H | L | L | L | X | X | X | H | H | L | H | H | X | X |
| TEST-D | H | L | L | L | X | X | X | H | H | L | L | H | X | X |

X: Don't care

FIG. 14

| | TEST1 | TEST2 | TEST3 | TEST4 | WEint | CLKint |
|---|---|---|---|---|---|---|
| TEST-A | L | L | L | L | = /WE | = CLK |
| TEST-B | H | H | H | L | = A09 | Disable |
| TEST-C | H | L | H | H | L | = A09 |
| TEST-D | H | L | L | H | H | = A09 |

SEMICONDUCTOR STORAGE DEVICE AND METHOD FOR PRODUCING SEMICONDUCTOR STORAGE DEVICE

CROSS-REFERENCE TO RELATED APPLICATION

This Application is a Divisional Application of U.S. patent application Ser. No. 12/360,621, filed Jan. 27, 2009; which claims priority to Japanese Application No.: 2008-019316, filed Jan. 30, 2008; the disclosure of each of which is hereby incorporated in its entirety by reference.

BACKGROUND OF THE INVENTION

1. Field of the Invention

The present application relates to a semiconductor storage device having a test function.

2. Description of Related Art

Before shipment, a semiconductor device is tested to determine whether or not the semiconductor device properly functions. In tests on semiconductor devices, probe pins of a tester are made to contact a plurality of pads of a semiconductor device at the same time and reception of test signals and detection of output signals are performed. Such tests are disclosed, for example, in Japanese Laid-open Patent Publication No. 2003-151299, Japanese Laid-open Patent Publication No. 2000-163997, and Japanese Laid-open Patent Publication No. H11-306796.

SUMMARY

According to one aspect of an embodiment, a semiconductor storage device is provided which comprises a timing control circuit that generates a signal for controlling at least one of a read operation and a write operation; an input-signal pad; a plurality of control-signal pads; and a switch circuit coupled to at least one of the plurality of control-signal pads. The switch circuit generates a first control signal to be supplied to the timing control circuit based on a signal from the input-signal pad in a first mode.

Additional advantages and novel features of the invention will be set forth in part in the description that follows, and in part will become more apparent to those skilled in the art upon examination of the following or upon learning by practice of the invention.

BRIEF DESCRIPTION OF THE DRAWINGS

FIG. 5 illustrates correspondences between test operation modes and input signals;

FIG. 6 illustrates correspondences between test operation modes and internal signals;

FIGS. 9A to 9C illustrate signal waveforms when switching a test operation mode;

FIG. 13 illustrates correspondences between test operation modes and input signals;

FIG. 14 illustrates correspondences between test operation modes and internal signals;

DESCRIPTION OF PREFERRED EMBODIMENTS

In order to reduce the number of pads that need to be coupled in a test of a semiconductor storage device, all the control-signal pads for receiving control signals are coupled to a tester, whereas some of address pads for receiving addresses are coupled to the tester. In order to fix an internal signal of an uncoupled address pad, n/2 bits of an n-bit address are loaded in time division from a coupled pad in each of two loading operations and the loaded bits of the address are expanded to the n-bit address inside the semiconductor storage device.

Since a test code is input to an address pad when entering a test mode, the reduction of the number of address pads coupled to a tester has limitations. In addition, since in control-signal pads, an internal timing control signal should be generated based on a combination of input control signals, a change with time, or the like, it is difficult to load signals in a time series manner. Thus, the number of control-signal pads coupled to a tester is not reduced.

Figure 1:
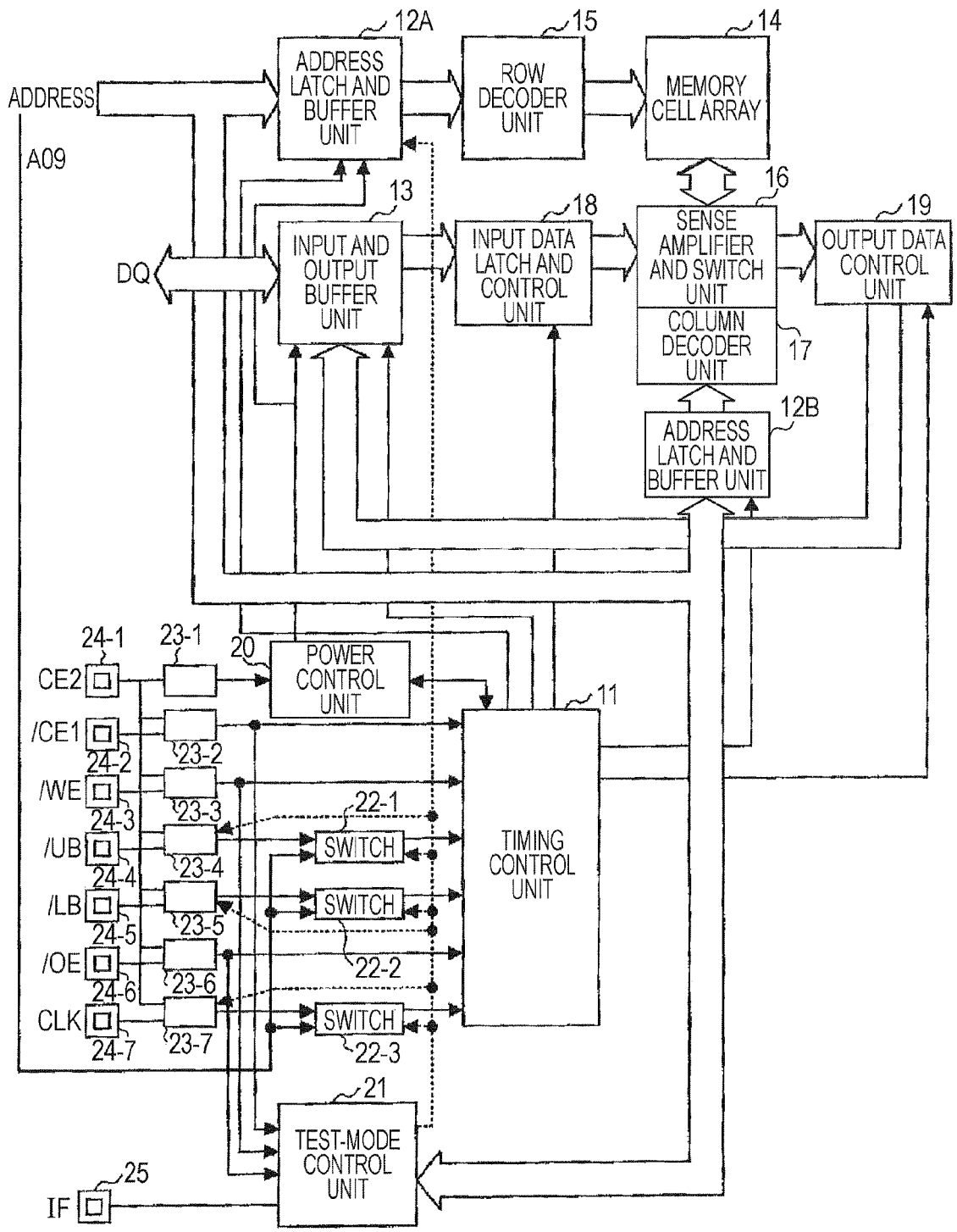
FIG. 1 illustrates a first embodiment.

FIG. 1 illustrates a first embodiment. A semiconductor storage device 10 includes a timing control unit 11, an address latch and buffer unit 12A, an address latch and buffer unit 12B, an input and output buffer unit 13, a memory cell array 14, a row decoder unit 15, a sense amplifier and switch unit 16, a column decoder unit 17, an input data latch and control unit 18, an output data control unit 19, a power control unit 20, a test-mode control unit 21, switch circuits 22-1 to 22-3, input buffers 23-1 to 23-7, and a plurality of control-signal pads 24-1 to 24-7. The semiconductor storage device 10 may be, for example, a pseudo-static random access memory (SRAM), which is a dynamic random access memory (DRAM) including an interface that is compatible with an SRAM. However, in the first embodiment, the semiconductor storage device 10 is not necessarily limited to a pseudo-SRAM. The first embodiment may be applied to a different type of semiconductor storage device.

The timing control unit 11 receives control signals from the outside of a chip of the semiconductor storage device 10. The control signals are, for example, a chip-enable signal /CE1, a write-enable signal /WE, a data byte control signal /UB, a data byte control signal /LB, an output-enable signal /OE, and a clock signal CLK. A chip-enable signal CE2 controls reception of a control signal and activates or inactivates the power control unit 20. When the chip-enable signal CE2 is activated (at a high level), the input buffers 23-2 to 23-7 are activated. Signals /CE1, /WE, /UB, /LB, /OE, and CLK applied to the control-signal pads 24-2 to 24-7 are supplied through corresponding input buffers to the semiconductor storage device 10. The power control unit 20 activates the timing control unit 11, the address latch and buffer unit 12A, and the input and output buffer unit 13 in response to the chip-enable signal CE2.

The semiconductor storage device 10, as an interface compatible with an SRAM, masks an upper byte part of the input data and masks a lower byte part of the input data. In order to write or read an upper byte part of data to or from a memory cell, the data byte control signal /UB is set to a low level. When the data byte control signal /UB is at a high level, with the mask function, write and read of an upper byte part of data to and from a memory cell are not performed. In order to write or read a lower byte part of data to or from a memory cell, the data byte control signal /LB is set to a low level. When the data byte control signal /LB is at a high level, with the mask function, writing and reading of a lower byte part of data to and from a memory cell are not performed.

The timing control unit 11 generates a control signal or a timing signal corresponding to a designated operation, such as a data read operation or a data write operation in accordance with a control signal. The control signal or the timing signal is supplied to the address latch and buffer unit 12A, the address latch and buffer unit 12B, the input and output buffer unit 13, the input data latch and control unit 18, the output data control unit 19, and the power control unit 20.

The address latch and buffer unit 12A receives a row address signal from the outside of the semiconductor storage device 10. The row address signal is supplied to the row decoder unit 15. The address latch and buffer unit 12B receives a column address signal from the outside of the semiconductor storage device 10. The column address signal is supplied to the column decoder unit 17.

The memory cell array 14 includes a cell array in which a plurality of memory cells are arranged in a matrix in rows and columns. Data is stored in each of the memory cells. In the memory cell array 14, a plurality of word lines are arranged in association with row addresses and a plurality of memory cells are coupled to the word lines. A plurality of bit lines are arranged in a direction in which column addresses are arranged. The sense amplifier and switch unit 16 are coupled to corresponding bit lines.

The row decoder unit 15 decodes a row address supplied from the address latch and buffer unit 12A, and activates a word line selected by the row address. The column decoder unit 17 decodes a column address supplied from the address latch and buffer unit 12B, and activates a column selection line selected by the column address.

In a read operation, data of memory cells coupled to an activated word line is read to bit lines and amplified by the sense amplifier and switch unit 16. The data amplified by the sense amplifier and switch unit 16 is output through the output data control unit 19 and the input and output buffer unit 13 to the outside of the semiconductor storage device 10. In a write operation, write data supplied from the outside of the semiconductor storage device 10 through the input and output buffer unit 13 and the input data latch and control unit 18 is written to the sense amplifier and switch unit 16 selected by an activated column selection line. The write data and data, which is read from a memory cell, to be rewritten, are written to a memory cell coupled to an activated word line.

The test-mode control unit 21 receives internal signals corresponding to the chip-enable signal /CE1, the write-enable signal /WE, and the output-enable signal /OE, some of address signals applied from the outside, and a signal applied to an IF pad 25. Based on these signals, the test-mode control unit 21 controls test mode entry, test operation mode switching, and test operation.

When the semiconductor storage device 10 is used as a memory device, a normal mode is set. When internal functions of the semiconductor storage device 10 are tested, a test mode is set. The test-mode control unit 21 controls setting of the normal mode or the test mode based on an external command, such as a test command, or an external signal, such as an address signal.

In the semiconductor storage device 10 illustrated in FIG. 1, the switch circuits 22-1 to 22-3 are provided in association with the data byte control signal /UB, the data byte control signal /LB, and the clock signal CLK, respectively. The switch circuits 22-1 to 22-3 are coupled through the input buffers 23-4, 23-5, and 23-7 to the control-signal pads 24-4, 24-5, and 24-7, respectively. The switch circuits 22-1 to 22-3 receive an address signal A09 (one bit) from one of address-signal pads and receive a test control signal from the test-mode control unit 21.

In the normal mode, the switch circuits 22-1 to 22-3 generate output signals based on signals from the control-signal pads 24-4, 24-5, and 24-7, respectively. Output signals from the switch circuits 22-1 to 22-3 are supplied to the timing control unit 11. Signals applied to the control-signal pads 24-2, 24-3, and 24-6 are supplied through the input buffers 23-2, 23-3, and 23-6, respectively, to the timing control unit 11. In the normal mode, the timing control unit 11 generates internal control signals and timing signals in accordance with the signals /CE1, /WE, /UB, /LB, /OE, and CLK applied to the control-signal pads 24-2 to 24-7, respectively, and controls a memory operation of the semiconductor storage device 10.

In the test mode, the switch circuits 22-1 to 22-3 output signals at a high level or a low level in response to a test control signal from the test-mode control unit 21. The switch circuits 22-1 to 22-3 output control signals in response to a signal from a different input-signal pad, for example an address-signal pad for an address signal A09. The test control signal from the test-mode control unit 21 controls generation of control signals of the switch circuits 22-1 to 22-3.

In the test mode, voltage levels of the control-signal pads 24-4, 24-5, and 24-7 do not affect outputs of the switch circuits 22-1 to 22-3. Output signals of the switch circuits 22-1 to 22-3 are independent of the voltage levels of the control-signal pads 24-4, 24-5, and 24-7. Signals generated by the switch circuits 22-1 to 22-3 are supplied to the timing control unit 11. Signals applied to the control-signal pads 24-2, 24-3, and 24-6 are supplied through the input buffers 23-2, 23-3, and 23-6, respectively, to the timing control unit 11. In the test mode, the timing control unit 11 generates internal control signals and timing signals, independently of the voltages of the control-signal pads 24-4, 24-5, and 24-7, based on the signals generated by the switch circuits 22-1 to 22-3 and the signals /CE1, /WE, and /OE applied to the control-signal pads 24-2, 24-3, and 24-6, respectively, and controls a test operation of the semiconductor storage device 10. In the test mode, probe pins of an external tester are not in contact with the control-signal pads 24-4, 24-5, and 24-7.

As described above, the number of pads of a semiconductor storage device coupled to a tester during a test operation is reduced. In the first embodiment, some pads of the control-signal pads are coupled to a tester. The number of control signal pads, which are not coupled to a tester with the use of switch circuits, may be a plural number n. In addition, internal signals corresponding to n control-signal pads may be generated based on signals applied to different input-signal pads whose number is smaller than n. A control signal generated by a switch circuit based on a signal applied to a different input-signal pad may be a signal that changes with time. A signal that changes with time may be, for example, a synchronization signal for controlling synchronous read and write operations of the semiconductor storage device 10.

Manufacturers of semiconductor devices may eliminate semiconductor storage devices that have been determined to be defective by tests and may ship semiconductor storage devices that have been determined to be non-defective by tests.

Figure 2:
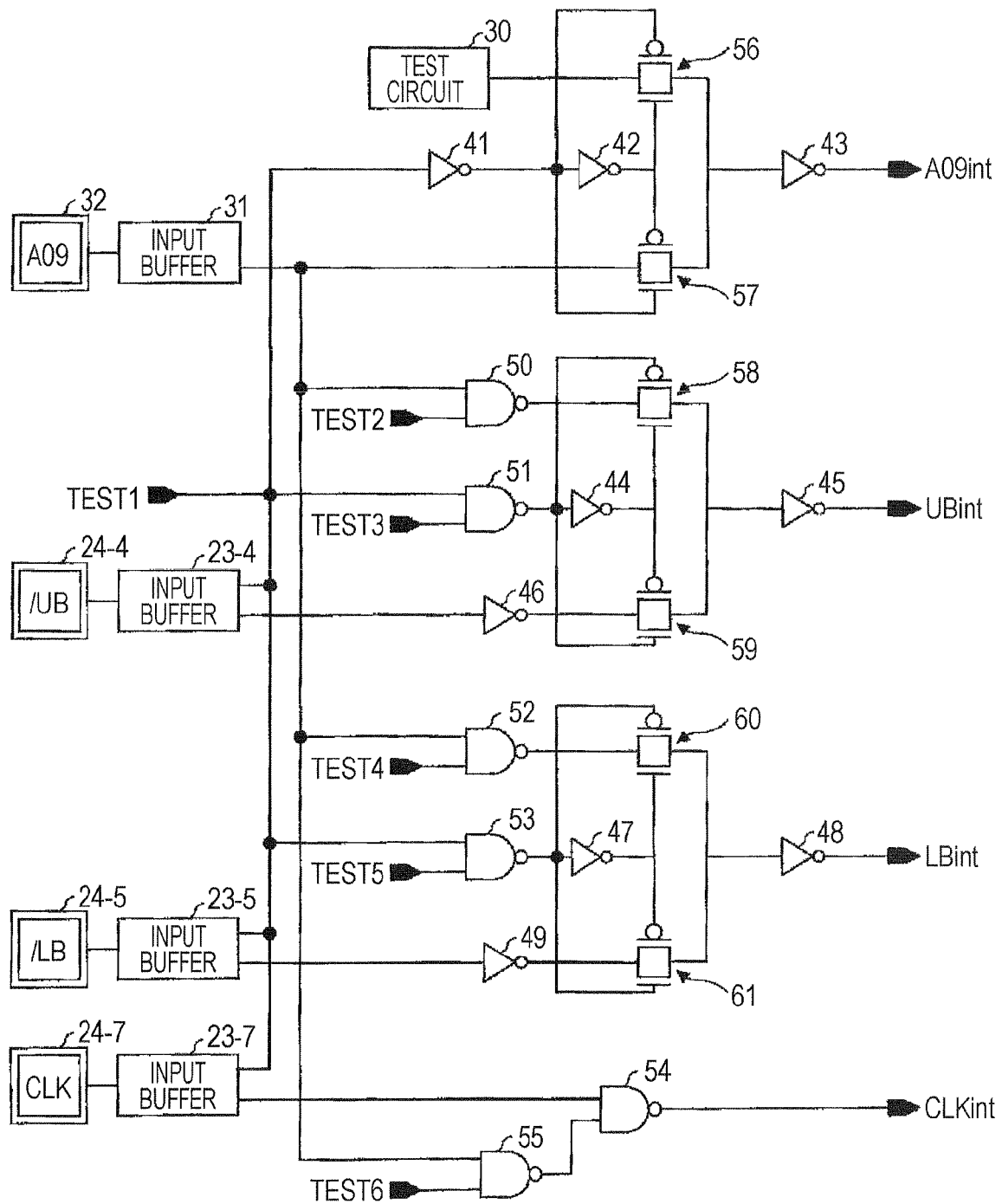
FIG. 2 illustrates exemplary switch circuits and peripheral circuits.

FIG. 2 illustrates exemplary switch circuits and peripheral circuits of the semiconductor storage device 10. In the normal mode, the address signal A09 input to an address-signal pad 32 is supplied, as an internal address signal A09int, through a switch circuit for the address signal A09 to the address latch and buffer unit 12A (see FIG. 1). In the test mode, an output signal of a test circuit 30 is supplied, as an internal address signal A09int, through the switch circuit for the address signal A09 to the address latch and buffer unit 12A.

In the semiconductor storage device 10 illustrated in FIG. 1, probe pins of a tester are made to contact eight address-signal pads corresponding to address signals A00 to A07, and address signals A00 to A15 (16-bit address signals) are supplied through the eight address-signal pads to the semiconductor storage device 10. At a first timing, eight bits constituting address signals A08 to A15 are input through the eight address-signal pads. At a second timing, eight bits constituting address signals A00 to A07 are input through the eight address-signal pads. Inside the semiconductor storage device 10, two eight-bit data are expanded so that a sixteen-bit address signal is generated. The test circuit 30 illustrated in FIG. 2 outputs an address signal generated within the test circuit 30. In the first embodiment, by using the address-signal pad 32 (a pad for the address signal A09) to which no address signal is input, internal control signals corresponding to the control-signal pads 24-4, 24-5, and 24-7 that are not in contact with probe pins of the tester are generated.

The switch circuits include inverters 41 to 49, NAND circuits 50 to 55, and transfer gates 56 to 61. The transfer gates 56 to 61 each include a P-channel metal-oxide semiconductor (PMOS) transistor and an N-channel metal-oxide semiconductor (NMOS) transistor which are coupled in parallel. The switch circuit for the address signal A09 includes the inverters 41 to 43 and the transfer gates 56 and 57. The switch circuit 22-1 for the data byte control signal /UB in FIG. 1 includes the inverters 44 to 46, the NAND circuits 50 and 51, and the transfer gates 58 and 59. The switch circuit 22-2 for the data byte control signal /LB in FIG. 1 includes the inverters 47 to 49, the NAND circuits 52 and 53, and the transfer gates 60 and 61. The switch circuit 22-3 for the clock signal CLK in FIG. 1 includes the NAND circuits 54 and 55.

Referring to FIG. 2, test control signals TEST1 to TEST6 are supplied from the test-mode control unit 21 illustrated in FIG. 1. The test control signal TEST1 is applied to the input buffers 23-4, 23-5, and 23-7. Although the chip-enable signal CE2 is supplied to each of the input buffers as illustrated in FIG. 1, supply of the chip-enable signal CE2 is omitted in FIG. 2. Based on the test control signal TEST1, the input buffers 23-4, 23-5, and 23-7 control whether or not signals from corresponding control-signal pads are to be supplied to the internal circuits. When the test control signal TEST1 is at a high level, outputs of the input buffers 23-4, 23-5, and 23-7 are set to a high level.

The circuits illustrated in FIG. 2 generate internal signals UBint, LBint, and CLKint corresponding to the data byte control signal /UB, the data byte control signal /LB, and the clock signal CLK. The internal signals UBint, LBint, and CLKint are supplied to the timing control unit 11 illustrated in FIG. 1. In the normal mode of the semiconductor storage device 10, the internal signals UBint, LBint, and CLKint correspond to the data byte control signal /UB, the data byte control signal /LB, and the clock signal CLK applied from the outside. In the test mode of the semiconductor storage device 10, each of the internal signals UBint, LBint, and CLKint is a signal at a high level, a low level, or a signal supplied from the address-signal pad 32.

Figure 3:
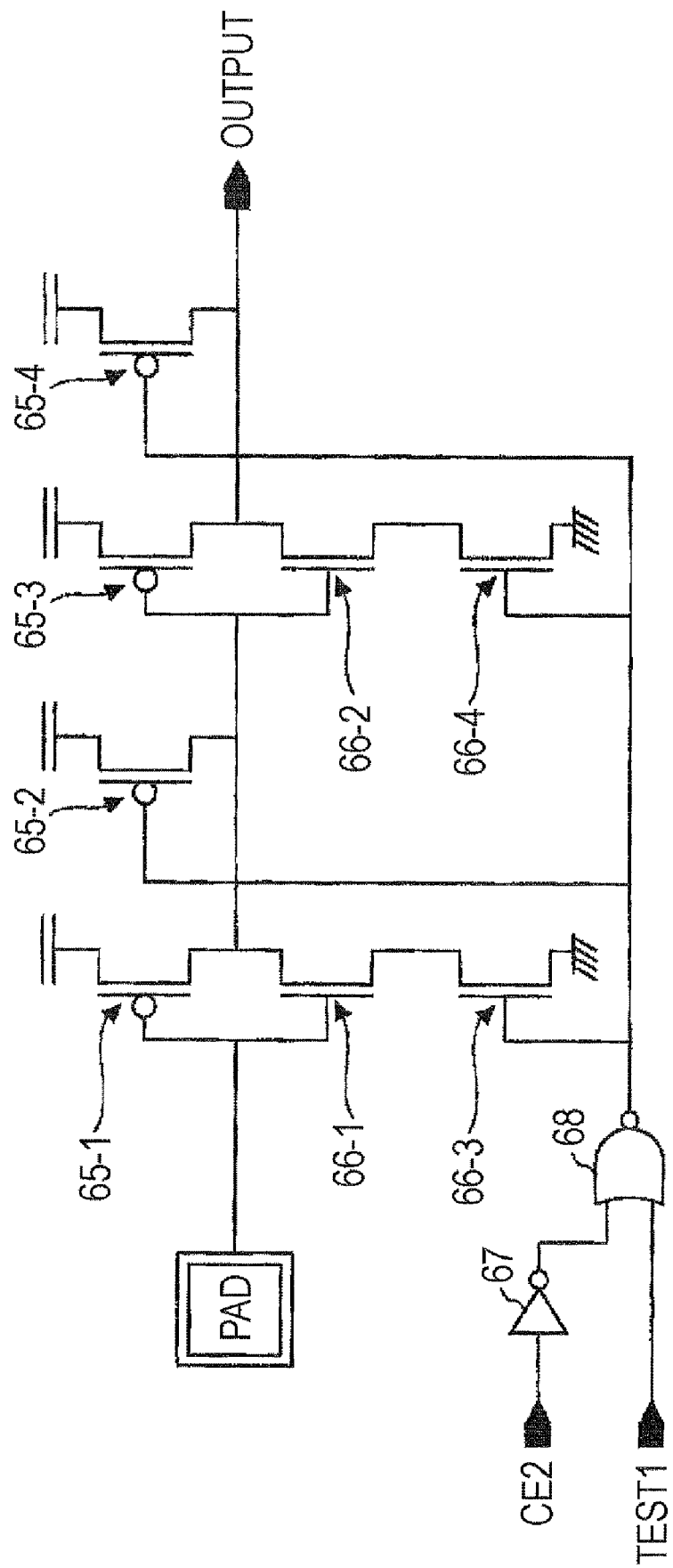
FIG. 3 illustrates an exemplary input buffer.

FIG. 3 illustrates an exemplary input buffer. The input buffer illustrated in FIG. 3 may be, for example, one of the input buffers 23-4, 23-5, and 23-7 illustrated in FIG. 1. The input buffer illustrated in FIG. 3 includes PMOS transistors 65-1 to 65-4, NMOS transistors 66-1 to 66-4, an inverter 67, and a NOR circuit 68. When the test control signal TEST1 is at a high level or the chip-enable signal CE2 is at a low level, the PMOS transistor 65-4 is brought into conduction, and an output of the input buffer is set to a high level. When the test control signal TEST1 is at a low level and the chip enable signal CE2 is at a high level, an input signal applied to a pad serves as an output signal of the input buffer.

The test control signal TEST1 is not input to the other input buffers 23-2, 23-3, and 23-6 illustrated in FIG. 1. Each of the input buffers 23-2, 23-3, and 23-6 is, for example, a circuit obtained by eliminating the inverter 67 and the NOR circuit 68 from the input buffer illustrated in FIG. 3 so that the chip-enable signal CE2 is set to a signal that corresponds to an output of the NOR circuit 68 of the input buffer illustrated in FIG. 3. In such an input buffer, an output signal is set to a high level when the chip-enable signal CE2 is at a low level, and an input signal applied to a pad serves as an output signal when the chip-enable signal CE2 is at a high level.

Figure 4:
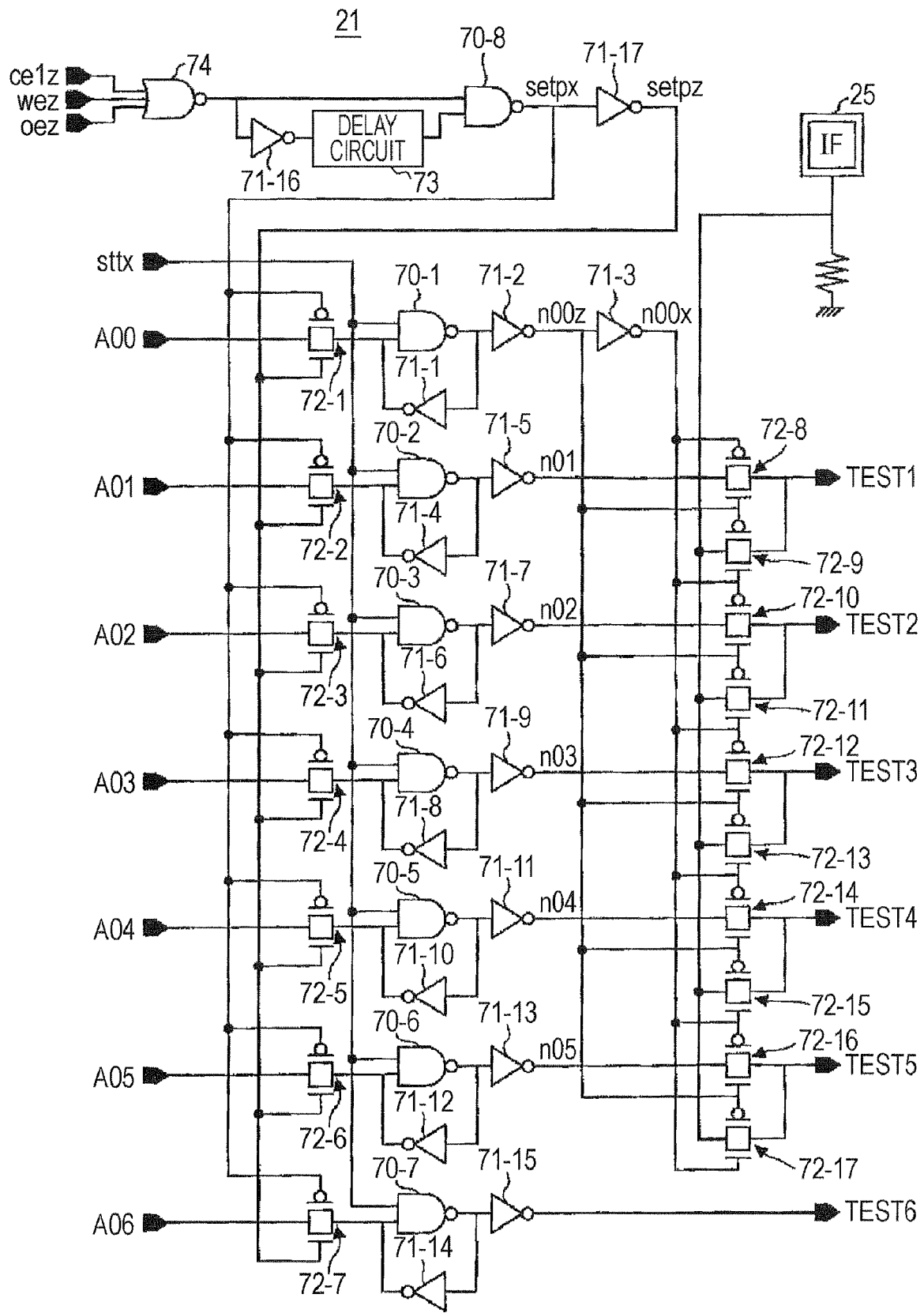
FIG. 4 illustrates an exemplary test-mode control unit.

FIG. 4 illustrates an exemplary test-mode control unit 21. The test-mode control unit 21 illustrated in FIG. 4 includes NAND circuits 70-1 to 70-8, inverters 71-1 to 71-17, transfer gates 72-1 to 72-17, a delay circuit 73, and a NOR circuit 74. The transfer gates 72-1 to 72-17 each include a PMOS transistor and an NMOS transistor which are coupled in parallel.

In response to the signals /CE1, /WE, and /OE applied to the control-signal pads 24-2, 24-3, and 24-6, respectively, signals ce1z, wez, and oez are output from the input buffers 23-2, 23-3, and 23-6, respectively. The logical values of the signals ce1z, wez, and oez are that corresponds to the logical values of the signals /CE1, /WE, and /OE, respectively. When all the signals /CE1, /WE, and /OE are at a low level, an output of the NOR circuit 74 is changed from a low level to a high level. After this change, an output of the delay circuit 73 is at a high level for a given period of time. Thus, an output setpx of the NAND circuit 70-8 is at a low level for the given period of time, and an output setpz of the inverter 71-17 is at a high level for the given period of time. For the given period of time, the transfer gates 72-1 to 72-7 are brought into conduction, and the address signals A00 to A06 are loaded into latches of the test-mode control unit 21. In each of the latches, a NAND circuit receives an output of an inverter, and the inverter receives an output of the NAND circuit. For example, the address signal A00 is stored in a latch including the NAND circuit 70-1 and the inverter 71-1. The same is applied to other address signals. When the power is turned on, a signal sttx is at a low level, and then is set to a high level. In accordance with the signal sttx, the latches are initialized when the power is turned on.

When all the signals /CE1, /WE, and /OE are set to a low level, the semiconductor storage device 10 illustrated in FIG. 1 enters the test mode. When entering the test mode, the address signals A00 to A06 are loaded into latches of the test-mode control unit 21. When the latched address signal A00 is at a high level, the test control signals TEST1 to TEST6 output from the test-mode control unit 21 have the same signal levels as the signal levels of the latched address signals A01 to A06. When the latched address signal AUG is at a low level, the test control signals TEST1 to TEST6 output from the test-mode control unit 21 have voltages applied to the IF pad 25.

FIG. 5 illustrates the correspondences between test operation modes and input signals. Test operation modes are set by the test-mode control unit 21 illustrated in FIG. 1. For example, when the chip-enable signal CE2 is set to a high level and all the signals /CE1, /WE, and /OE are set to a low level, the semiconductor storage device 10 illustrated in FIG. 1 enters the test mode. When the address signal A00 latched at the time of entering the test mode is at a high level, a test operation mode is determined in accordance with the address signals A01 to A06 latched at the time of entering the test mode. For example, when all the address signals A01 to A06 are at a low level, a test operation mode TEST-A is designated. For example, when the address signals A01, A02, A03, A04, A05, and A06 are at a high level, a low level, a high level, a low level, a high level, and a high level, respectively, a test operation mode TEST-E is designated. For example, when the address signals A01, A02, A03, A04, A05, and A06 are at a high level, a high level, a high level, a low level, a low level, and a high level, respectively, a test operation mode TEST-G is designated. As illustrated in FIG. 5, test operation modes designated by the test-mode control unit 21 do not depend on the signal levels of the data byte control signal /UB, the data byte control signal /LB, and the clock signal CLK.

FIG. 6 illustrates the relationships between the test control signals for the test operation modes and the internal signals UBint, LBint, and CLKint. For example, in a test operation mode TEST-B, the test control signals TEST1 to TEST5 are at a high level and the test control signal TEST6 is at a low level. When the test control signals TEST1 to TEST3 are at a high level, the address signal A09 applied to the address-signal pad 32 illustrated in FIG. 2 is output as a signal UBint through the transfer gate 58. When the test control signals TEST1, TEST4, and TEST5 are at a high level, the address signal A09 applied to the address-signal pad 32 illustrated in FIG. 2 is output as a signal LBint through the transfer gate 60. When the test control signal TEST 1 is at a high level and the test control signal TEST6 is at a low level, a signal at a low level is output as a signal CLKint from the NAND circuit 54. In the test operation mode TEST-B, as illustrated in FIG. 6, the signal UBint is set to a signal that corresponds to the address signal A09, the signal LBint is set to a signal that corresponds to the address signal A09, and the signal CLKint is set to a low level, for example to a disabled state.

For example, in the test operation mode TEST-E, the test control signals TEST1, TEST2, TEST3, TEST4, TEST5, and TEST6 are set to a high level, a low level, a high level, a low level, a high level, and a high level, respectively. When the test control signals TEST1, TEST2, and TEST3 are set to a high level, a low level, and a high level, respectively, an output at a high level of the NAND circuit 50 illustrated in FIG. 2 is output as a signal UBint at a low level through the transfer gate 58. When the test control signals TEST1, TEST4, and TEST5 are set to a high level, a low level, and a high level, respectively, an output at a high level of the NAND circuit 52 is output as a signal LBint at a low level through the transfer gate 60. When the test control signal TEST1 is set to a high level and the test control signal TEST6 is set to a high level, the address signal A09 applied to the address-signal pad 32 is output as a signal CLKint through the NAND circuits 55 and 54. In the test operation mode TEST-E, as illustrated in FIG. 6, the signal UBint is set to a low level, the signal LBint is set to a low level, and the signal CLKint is set to a signal that corresponds to the address signal A09.

In the test operation modes TEST-B to TEST-D, either both or either one of the signal UBint and the signal Lbint are set to a signal that corresponds to the address signal A09. The address signal A09, which changes with time so as to be alternately set to a high level and a low level, serves as a synchronization signal, such as a clock signal, for synchronous write and read operations. The synchronous write and read operations may also be performed in accordance with a synchronization signal, such as a clock signal, which changes with time so as to be alternately set to a high level and a low level.

Figure 7:
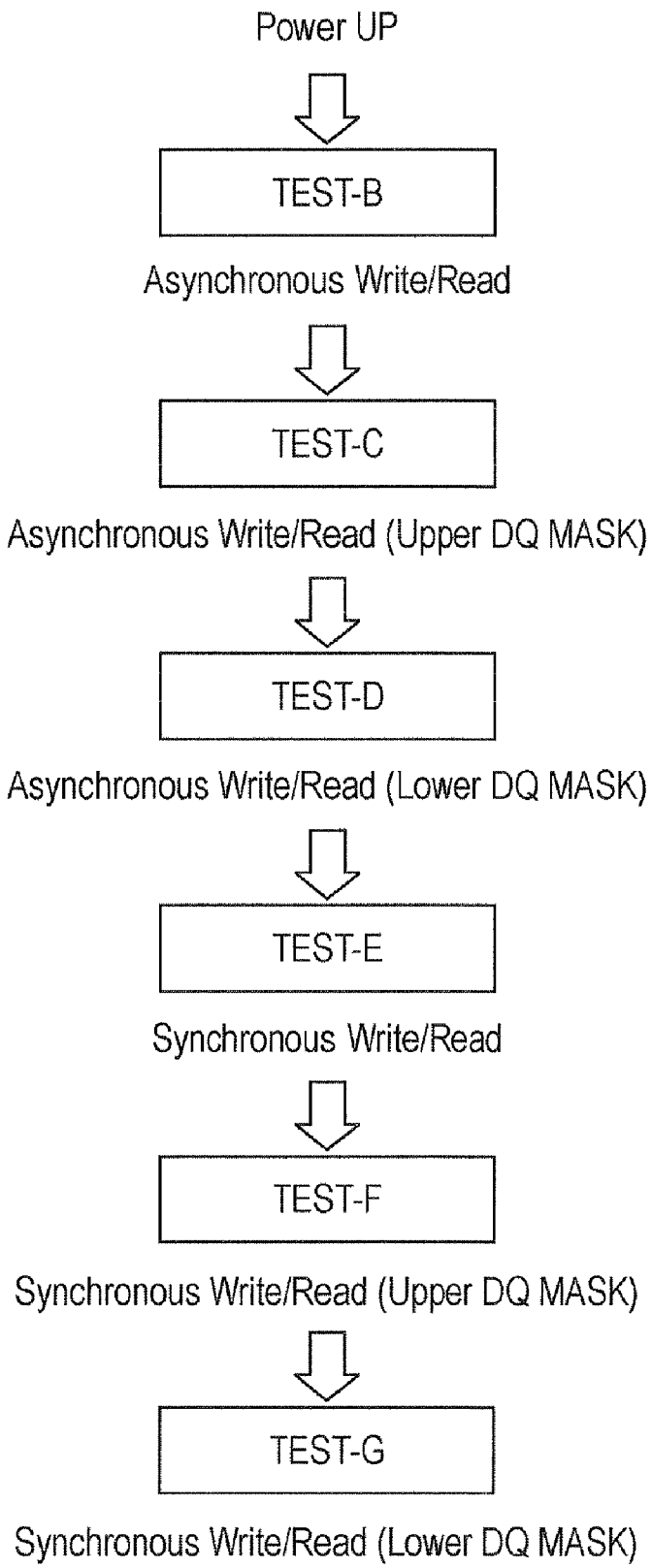
FIG. 7 illustrates switching of a test operation mode.
Figure 8:
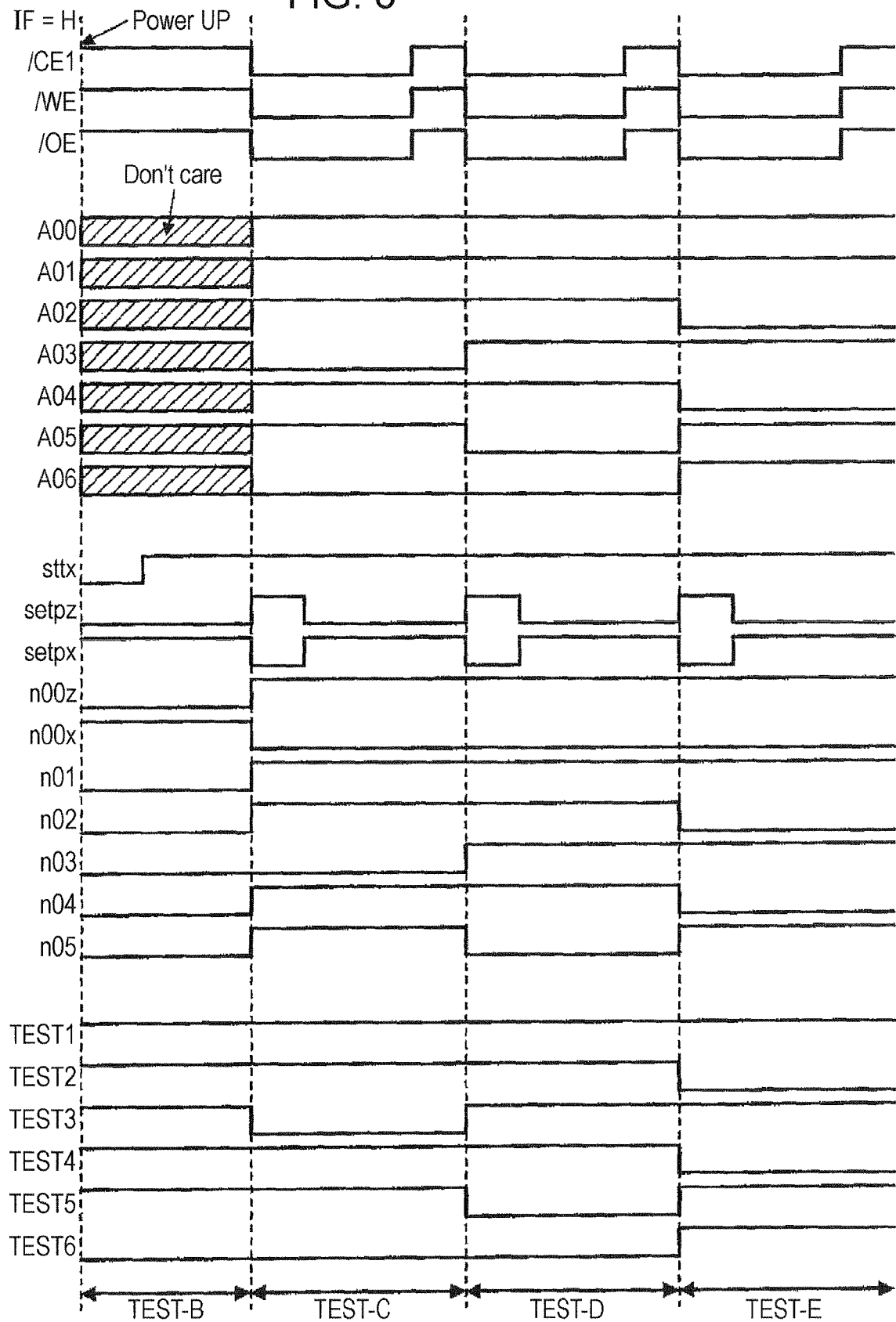
FIG. 8 illustrates signal waveforms in a test-mode control unit.
Figure 9B:
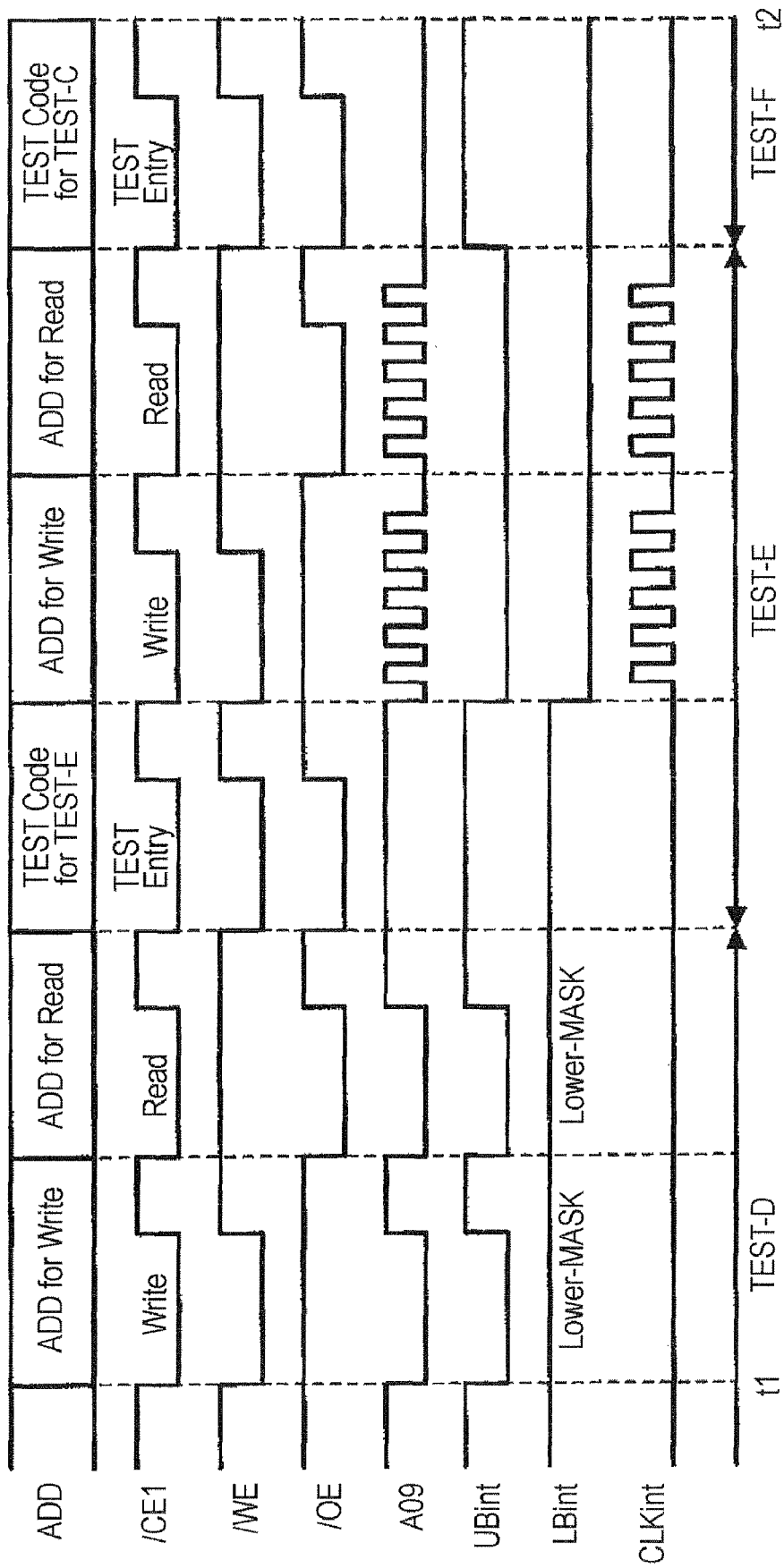

FIG. 7 illustrates operations for switching a test operation mode. FIG. 8 illustrates the waveforms of input and output signals of the test-mode control unit 21 illustrated in FIG. 4 when switching a test operation mode. FIGS. 9A to 9C illustrate signal waveforms in test operation modes when switching a test operation mode.

When a signal at a high level is applied to the IF pad 25 (see FIG. 4), the power of the semiconductor storage device 10 is turned on. Referring to FIG. 8, immediately after the power is turned on, the latch including the NAND circuit 70-1 and the inverter 71-1 illustrated in FIG. 4 is reset in accordance with the pulse signal sttx at a low level, and signals n00z and n00x illustrated in FIG. 4 are set to a low level and a high level, respectively. Thus, the signal at a high level applied to the IF pad 25 is output as the test control signals TEST1 to TEST5 from the test-mode control unit 21. The test control signal TEST6 is set to a low level in accordance with resetting of a corresponding latch. The waveforms of these signals are illustrated in FIG. 8. As illustrated in FIG. 6, the test operation mode TEST-B is set.

As illustrated in FIG. 7, in the test operation mode TEST-B, asynchronous write and read operations are performed. In such asynchronous operations, a clock signal is not input from the outside and the write and read operations are performed based on a clock signal generated by an internal oscillator. As illustrated in FIG. 9A, the chip-enable signal /CE1, the write-enable signal /WE, and the output-enable signal /OE are set to a low level, a low level, and a high level, respectively. The address signal A09 applied from the outside is set to a low level. In the test operation mode TEST-B, as illustrated in FIG. 6, the signal Ubint is set to a signal that corresponds to the address signal A09, the signal LBint is set to a signal that corresponds to the address signal A09, and the signal CLKint is set to a low level. Since the address signal A09 is set to a low level, as illustrated in FIG. 9A, all the signals UBint, LBint, and CLKint are set to a low level. In response to these control signals, the timing control unit 11 illustrated in FIG. 1 writes input data to a designated address. Then, as illustrated in FIG. 9A, the chip-enable signal /CE1, the write-enable signal /WE, and the output-enable signal /OE are set to a low level, a high level, and a low level, respectively. In response to these control signals, the timing control unit 11 illustrated in FIG. 1 reads data from a designated address.

As illustrated in FIG. 7, after the test operation mode TEST-B, the test operation mode TEST-C is set. In order to switch a test operation mode, entering the test mode is performed. As illustrated in FIG. 8, all the chip-enable signal /CE1, the write-enable signal /WE, and the output-enable signal /OE are set to a low level. After entering the test mode, the address signals A00 to A06 are read into the latches of the test-mode control unit 21 illustrated in FIG. 4. As illustrated in FIG. 8, in order to enter the test operation TEST-C, the address signals A00, A01, A02, A03, A04, A05, and A06 are set to a high level, a high level, a high level, a low level, a high level, a high level, and a low level, respectively. The latch output signals n00z and n01 to n05 of the test-mode control unit 21 correspond to address signals. Thus, the test control signals TEST1, TEST2, TEST3, TEST4, TEST5, and TEST6 are set to a high level, a high level, a low level, a high level, a high level, and a low level, respectively. As illustrated in FIG. 6, entering the test operation mode TEST-C is performed. FIG. 9A illustrates the waveforms of the control signals when a test operation mode is shifted from the test operation mode TEST-B to the test operation mode TEST-C.

As illustrated in FIG. 7, in the test operation mode TEST-C, asynchronous write and read operations in which an upper byte part is masked are performed. As illustrated in FIG. 9A, the chip-enable signal /CE1, the write-enable signal /WE, and the output-enable signal /OE are set to a low level, a low level, and a high level, respectively. The address signal A09 applied from the outside is set to a low level. In the test operation mode TEST-C, as illustrated in FIG. 6, the signal UBint is set to a high level, the signal LBint is set to a signal that corresponds to the address signal A09, and the signal CLKint is set to a low level. Since the address signal A09 is set to a low level, as illustrated in FIG. 9A, the signals UBint, LBint, and CLKint are set to a high level, a low level, and a low level, respectively. In response to these control signals, the timing control unit 11 illustrated in FIG. 1 writes input data to a designated address while masking the upper byte part. Then, as illustrated in FIG. 9A, the chip-enable signal /CE1, the write-enable signal /WE, and the output-enable signal /OE are set to a low level, a high level, and a low level, respectively. In response to these control signals, the timing control unit 11 illustrated in FIG. 1 reads data from a designated address while masking the upper byte part.

As illustrated in FIG. 7, after the test operation mode TEST-C, the test operation mode TEST-D is set. In the test operation mode TEST-D, asynchronous write and read operations in which a lower byte part is masked are performed. Switching of an operation mode, a write operation, and a read operation in the test operation mode TEST-D are the same as the operations in the test operation mode TEST-C. However, in the test operation mode TEST-D, the low-order byte part is masked.

As illustrated in FIG. 7, after to the test operation mode TEST-D, the test operation mode TEST-E is set. As illustrated in FIG. 8, the chip-enable signal /CE1, the write-enable signal /WE, and the output enable signal /OE are set to a low level. After entering the test mode, the address signals A00 to A06 are read into the latches of the test-mode control unit 21 illustrated in FIG. 4. As illustrated in FIG. 8, in order to enter the test operation mode TEST-E, the address signals A00, A01, A02, A03, A04, A05, and A06 are set to a high level, a high level, a low level, a high level, a low level, a high level, and a high level, respectively. The latch output signals n00z and n01 to n05 of the test-mode control unit 21 correspond to address signals. The test control signals TEST1, TEST2, TEST3, TEST4, TEST5, and TEST6 are set to a high level, a low level, a high level, a low level, a high level, and a high level, respectively. As illustrated in FIG. 6, entering the test operation mode TEST-E is performed. FIG. 9B illustrates signal waveforms when a test operation mode is shifted from the test operation mode TEST-D to the test operation mode TEST-E.

As illustrated in FIG. 7, in the test operation mode TEST-E, synchronous write and read operations are performed. As illustrated in FIG. 9B, the chip enable signal /CE1, the write-enable signal /WE, and the output-enable signal /OE are set to a low level, a low level, and a high level, respectively. A clock signal (pulse train signal) that is alternately set to a high level and a low level is applied to the address signal A09. In the test operation mode TEST-E, as illustrated in FIG. 6, the signal UBint is set to a low level, the signal LBint is set to a low level, and the signal CLKint is set to a signal that corresponds to the address signal A09. Since the address signal A09 is set as a clock signal, as illustrated in FIG. 9B, the signal UBint is set to a low level, the signal LBint is set to a low level, and the signal CLKint is set to a signal that corresponds to a clock signal. In response to these control signals, the timing control unit 11 illustrated in FIG. 1 synchronous-writes input data to a designated address. Then, as illustrated in FIG. 9B, the chip-enable signal /CE1, the write-enable signal /WE, and the output-enable signal /OE are set to a low level, a high level, and a low level, respectively. In response to these control signals, the timing control unit 11 illustrated in FIG. 1 synchronous-reads data from a designated address.

As illustrated in FIG. 7, after the test operation mode TEST-E, the test operation mode TEST-F is set. Switching from the test operation mode TEST-E to the test operation mode TEST-F is performed similarly to the above-described switching operations. FIG. 9B illustrates the waveforms of the control signals when a test operation mode is shifted from the test operation mode TEST-E to the test operation mode TEST-F.

In the test operation mode TEST-F, as illustrated in FIG. 7, synchronous write and read operations in which an upper byte part is masked are performed. As illustrated in FIG. 9C, the chip-enable signal /CE1, the write-enable signal /WE, and the output-enable signal /OE are set to a low level, a low level, and a high level, respectively. A clock signal (pulse train signal) that is alternately set to a high level and a low level is applied to the address signal A09. In the test operation mode TEST-F, as illustrated in FIG. 6, the signal UBint is set to a high level, the signal LBint is set to a low level, and the signal CLKint is set to a signal that corresponds to the address signal A09. Since the address signal A09 is set as a clock signal, as illustrated in FIG. 9C, the signal UBint is set to a high level, the signal LBint is set to a low level, and the signal CLKint is set to a signal that corresponds to a clock signal. In response to these control signals, the timing control unit 11 illustrated in FIG. 1 synchronous-writes input data to a designated address while masking the upper byte part. As illustrated in FIG. 9C, the chip-enable signal /CE1, the write-enable signal /WE, and the output-enable signal /OE are set to a low level, a high level, and a low level, respectively. In response to these control signals, the timing control unit 11 illustrated in FIG. 1 synchronous-reads data from a designated address while masking the upper byte part.

As illustrated in FIG. 7, after the test operation mode TEST-F, the test operation mode TEST-G is set. In the test operation mode TEST-G, synchronous write and read operations in which a lower byte part is masked are performed. Switching of an operation mode, a synchronous write operation, and a synchronous read operation in the test operation mode TEST-G are the same as the operations in the test operation mode TEST-F. However, in the test operation mode TEST-G, a lower byte part is masked.

In the test mode, the semiconductor storage device 10 illustrated in FIG. 1 performs various tests on synchronous write and read functions, asynchronous write and read functions, mask functions, and the like.

Figure 10:
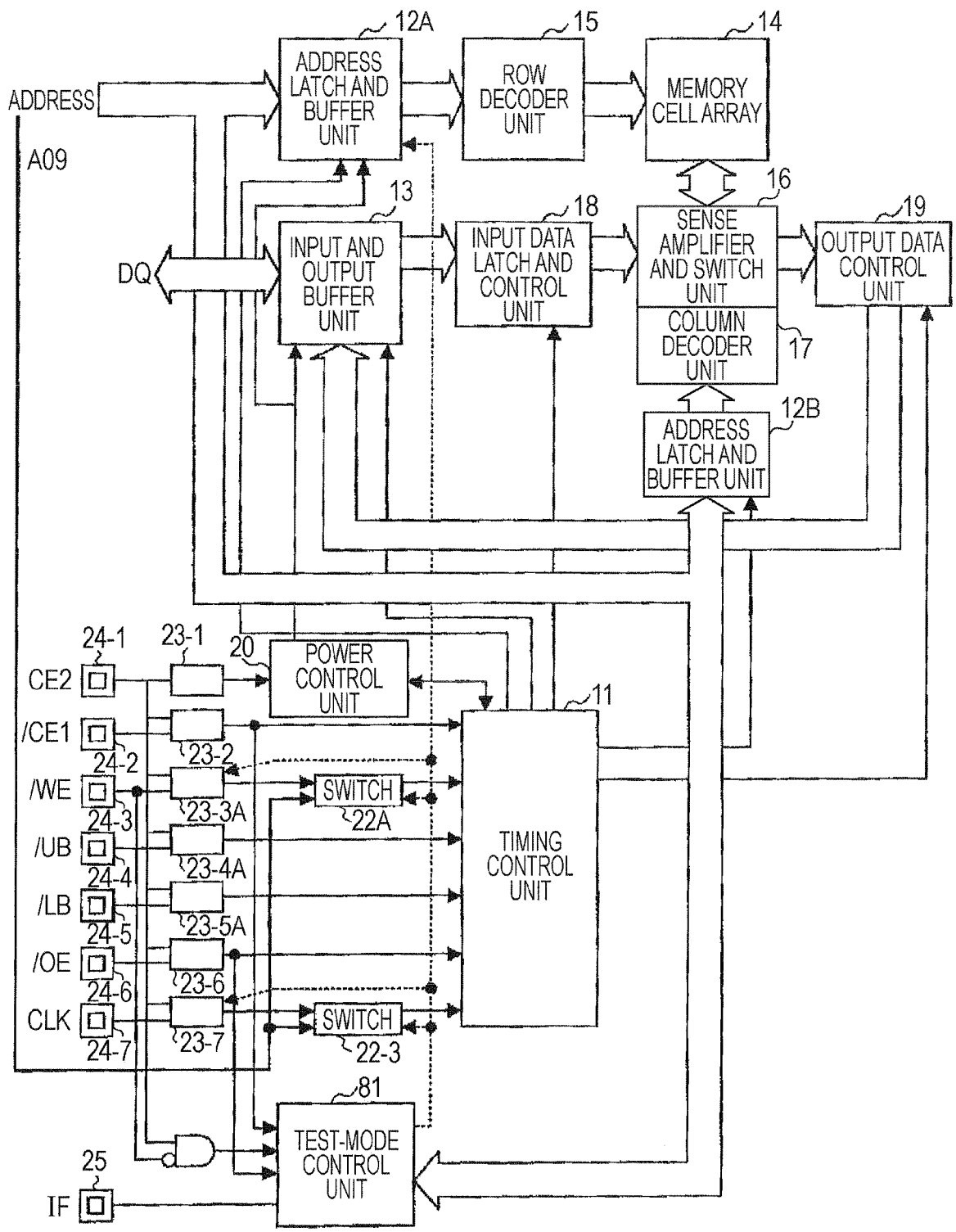
FIG. 10 illustrates a second embodiment.

FIG. 10 illustrates a second embodiment. In FIG. 10, the same elements as in FIG. 1 are represented by the same reference numerals and characters and the description of those same elements will be omitted. A semiconductor storage device 10A includes a switch circuit 22A, instead of the switch circuits 22-1 to 22-2 illustrated in FIG. 1. The semiconductor storage device 10A includes input buffers 23-3A to 23-5A, instead of the input buffers 23-3 to 23-5 illustrated in FIG. 1. The semiconductor storage device 10A includes a test-mode control unit 81, instead of the test-mode control unit 21.

The semiconductor storage device 10 illustrated in FIG. 1 includes switch circuits corresponding to the data byte control signal /UB, the data byte control signal /LB, and the clock signal CLK, and a tester is not made to contact the control-signal pads 24-4, 24-5, and 24-7 corresponding to these signals. The semiconductor storage device 10A illustrated in FIG. 10 includes switch circuits corresponding to the write-enable signal /WE and the clock signal CLK, and the tester is not made to contact the control-signal pads 24-3 and 24-7 corresponding to these signals. Input buffers, which receive the test control signal TEST1, and input buffers, which do not receive the test control signal TEST1, are the same as the input buffers in the first embodiment.

Figure 11:
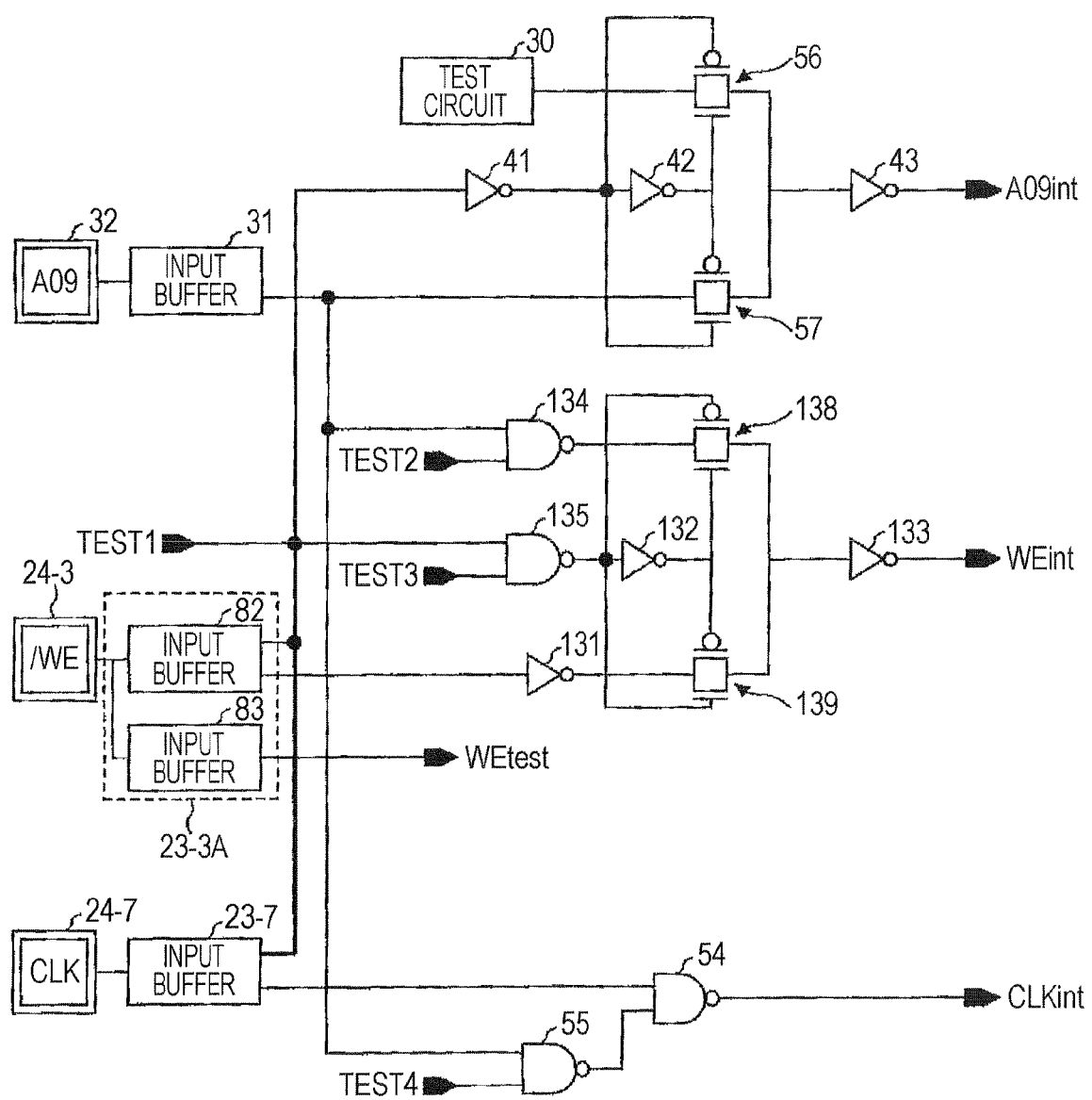
FIG. 11 illustrates an exemplary switch circuits and peripheral circuits.

FIG. 11 illustrates exemplary switch circuits and peripheral circuits. In FIG. 11, the same elements as in FIG. 2 are represented by the same reference numerals and characters and the description of those same elements will be omitted.

The switch circuit 22A includes inverters 131 to 133, NAND circuits 134 and 135, and transfer gates 138 and 139. Referring to FIG. 11, the test control signals TEST1 to TEST4 are supplied from the test-mode control unit 81 illustrated in FIG. 10. The test control signal TEST1 is applied to the input buffers 23-3A and 23-7. Although the chip-enable signal CE2 is supplied to each of the input buffers as illustrated in FIG. 10, supply of the chip-enable signal CE2 is omitted in FIG. 11. The input buffer 23-3A includes an input buffer part 82 and an input buffer part 83. When the test control signal TEST1 is at a high level, outputs of the input buffer part 82 and the input buffer 23-7 are at a high level.

The circuits illustrated in FIG. 11 generate internal signals WEint and CLKint corresponding to the write-enable signal /WE and the clock signal CLK. The internal signals WEint and CLKint are supplied to the timing control unit 11 illustrated in FIG. 10. In the normal mode of the semiconductor storage device 10A, the internal signals WEint and CLKint correspond respectively to the write-enable signal /WE and the clock signal CLK applied from the outside. In the test mode of the semiconductor storage device 10A, each of the internal signals WEint and CLKint is a signal at a given high level or a given low level, or a signal supplied from the address-signal pad 32.

Figure 12:
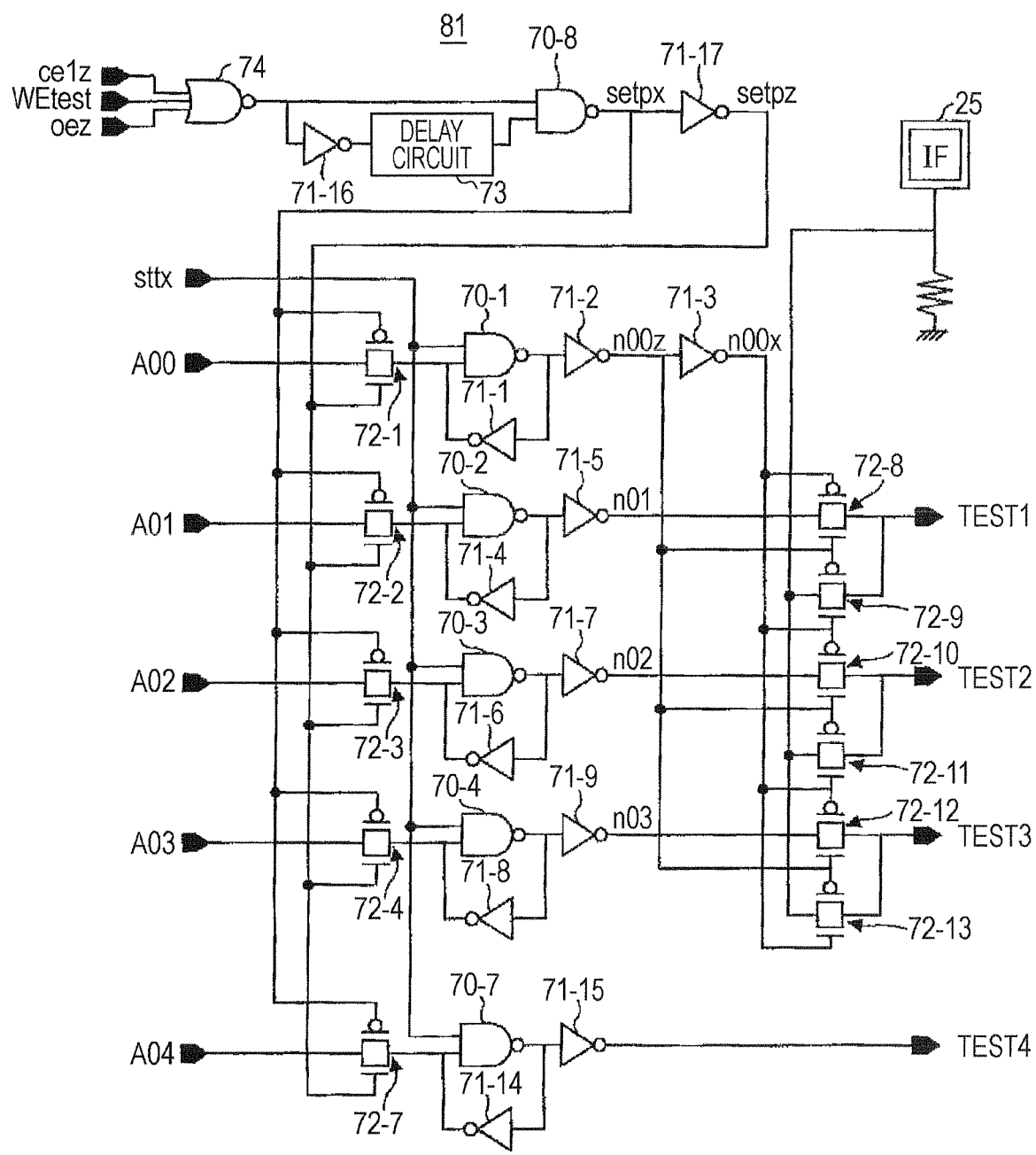
FIG. 12 illustrates an exemplary a test-mode control unit.

FIG. 12 illustrates an exemplary test-mode control unit 81. In FIG. 12, the same elements as in FIG. 4 are represented by the same reference numerals, and characters and the description of those same elements will be omitted. The test-mode control unit 21 illustrated in FIG. 4 generates the test control signals TEST1 to TEST6 based on the address signals A00 to A06. The test-mode control unit 81 illustrated in FIG. 12 generates the test control signals TEST1 to TEST4 based on the address signals A00 to A04. The number of bits constituting the address signals is reduced from six to four, and circuit portions corresponding to the reduced bits are eliminated. The other features of the circuit configuration are similar to those in the test-mode control unit 21 illustrated in FIG. 4.

FIG. 13 illustrates the correspondences between test operation modes and input signals. Test operation modes are set by the test-mode control unit 81 illustrated in FIG. 10. As illustrated in FIG. 13, when the chip-enable signal CE2 is set to a high level and all the signals /CE1, /WE, and /OE are set to a low level, entering the test mode is performed. When the address signal A00 latched at the time of entering the test mode is at a high level, a test operation mode is determined in accordance with the address signals A01 to A04 latched at the time of entering the test mode.

FIG. 14 illustrates the relationships between the test control signals for the test operation modes and the internal signals WEint and CLKint. For example, in the test operation mode TEST-B, the test control signals TEST1 to TEST3 are set to a high level and the test control signal TEST4 is set to a low level. In the test operation mode TEST-B, as illustrated in FIG. 14, the signal WEint is set to a signal that corresponds to the address signal A09, and the signal CLKint is set to a low level, for example, a disabled state.

For example, in the test operation mode TEST-D, the test control signals TEST1, TEST2, TEST3, and TEST4 are set to a high level, a low level, a low level, and a high level, respectively. In the test operation mode TEST-D, as illustrated in FIG. 14, the signal WEint is set to a high level and the signal CLKint is set to a signal that corresponds to the address signal A09.

Figure 15:
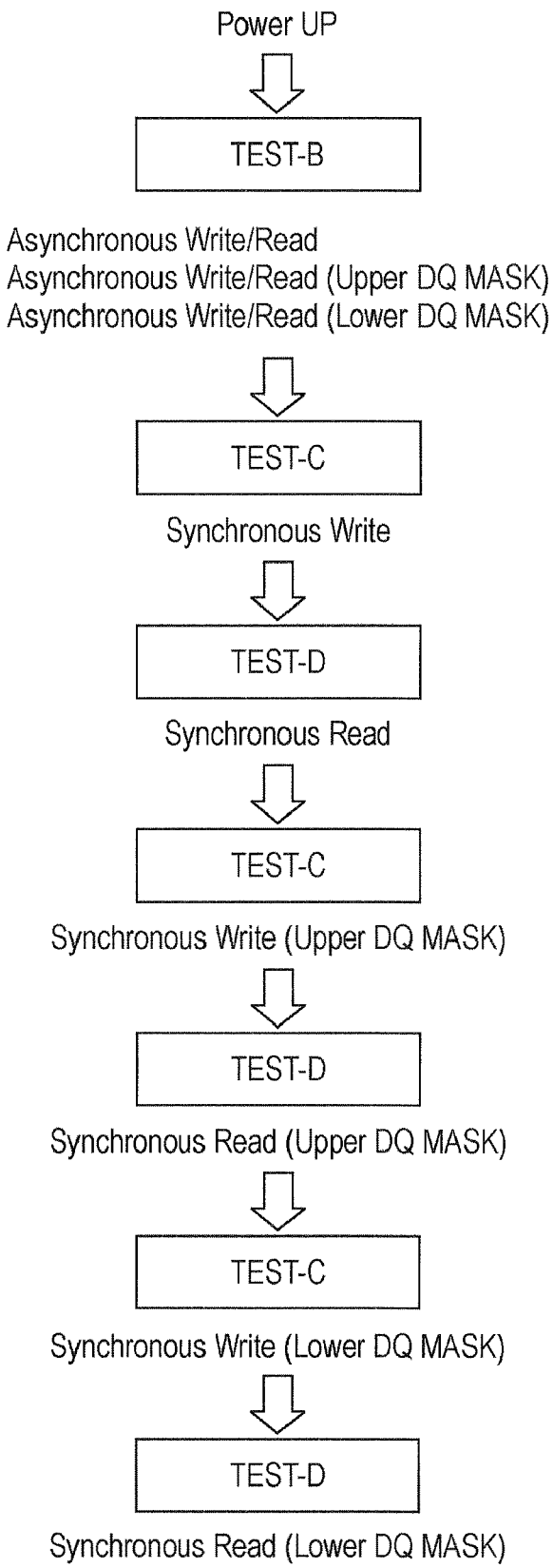
FIG. 15 illustrates switching of a test operation mode.
Figure 16:
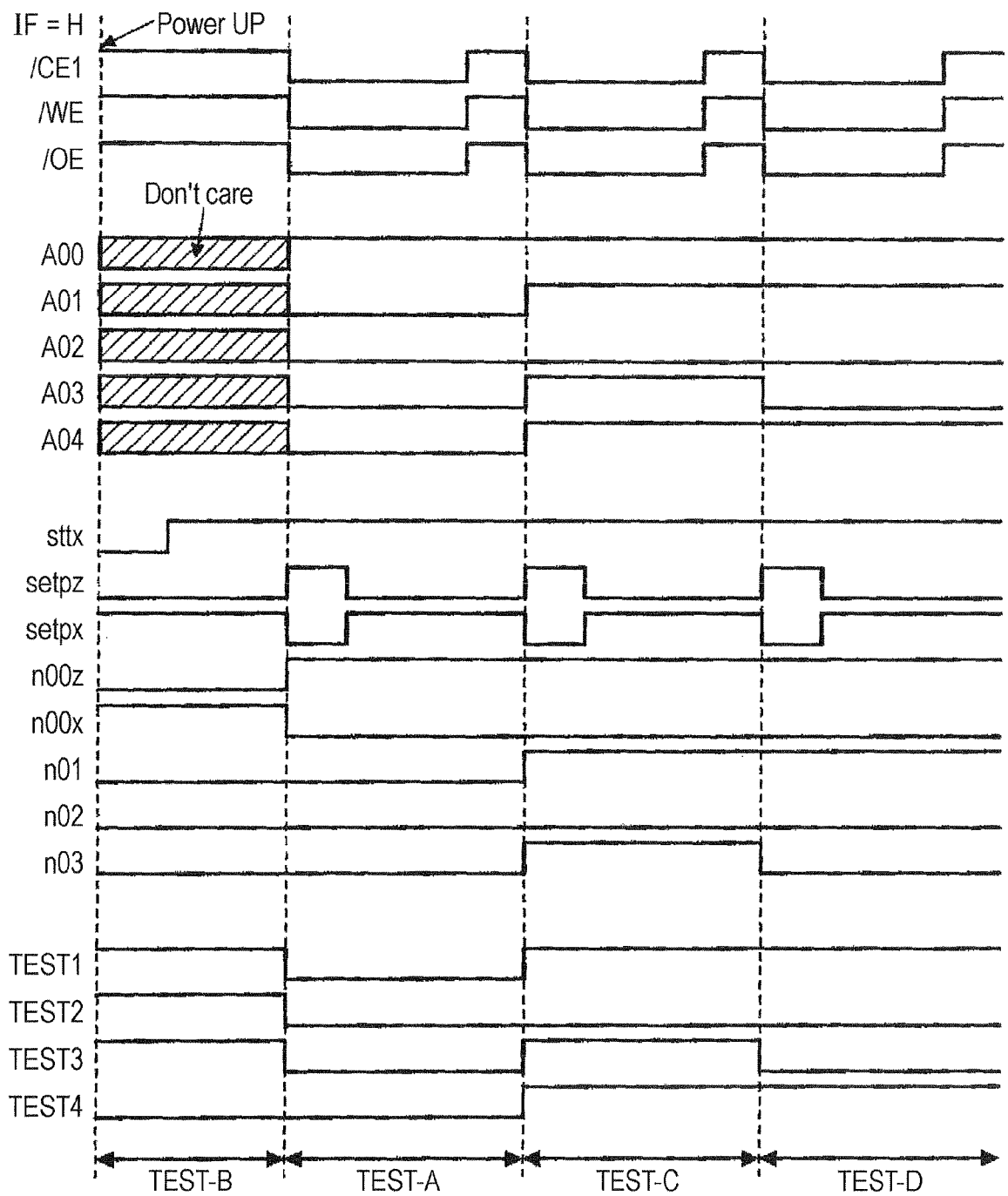
FIG. 16 illustrates signal waveforms in a test-mode control unit.
Figure 17A:
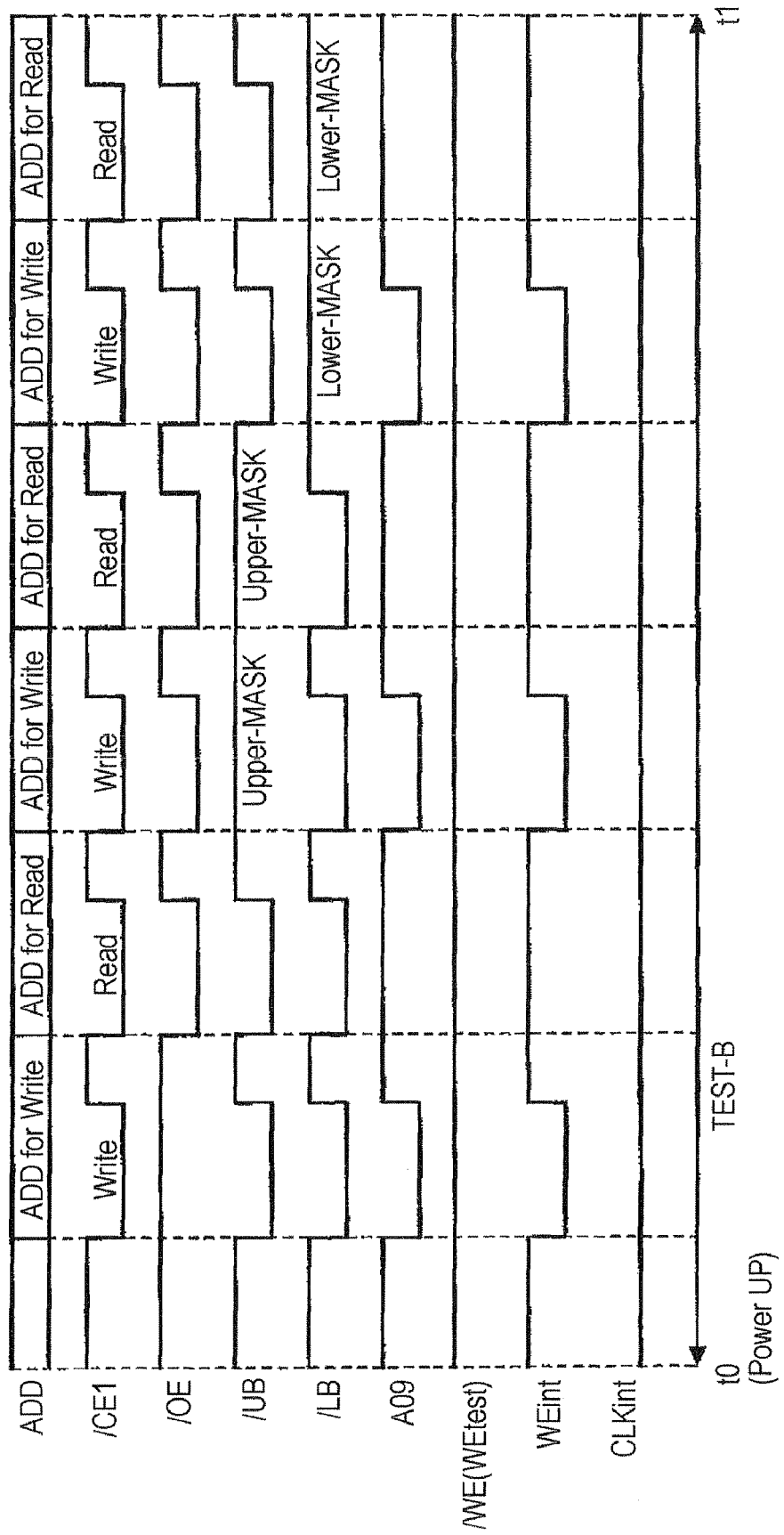
FIGS. 17A to 17C illustrate signal waveforms when switching a test operation mode.
Figure 17B:
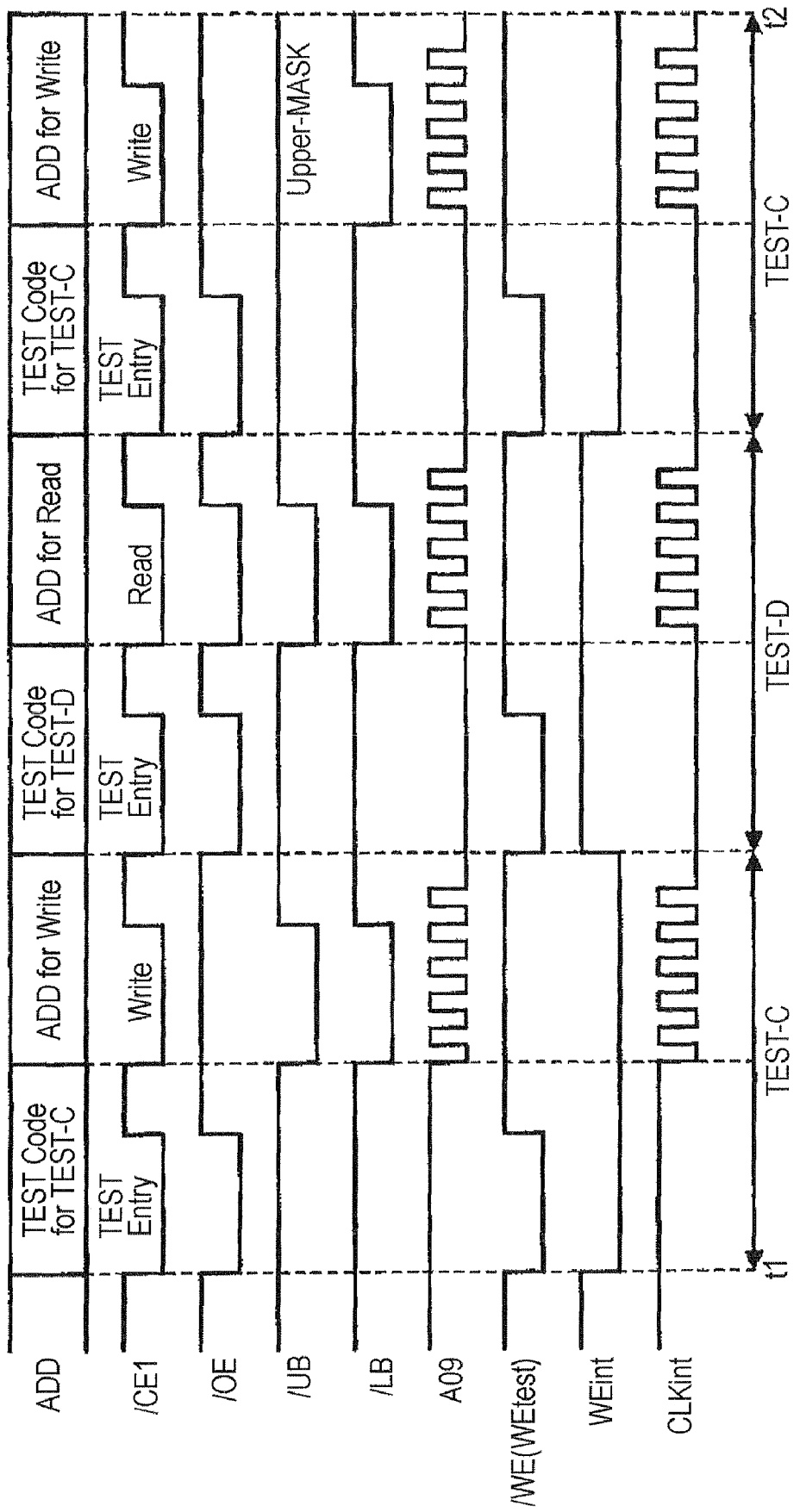
Figure 17C:
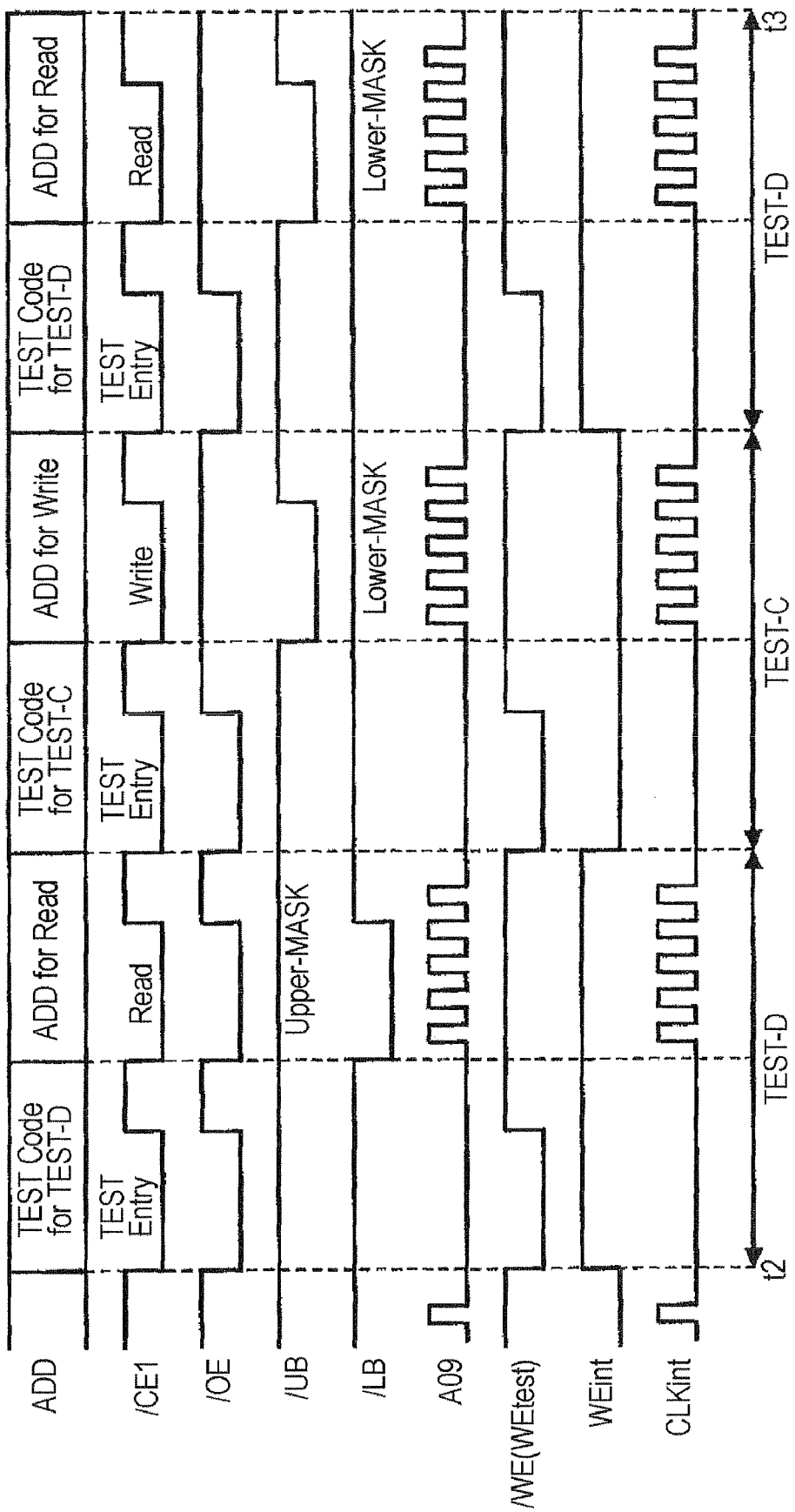

FIG. 15 illustrates switching test operation modes. FIG. 16 illustrates the waveforms of input and output signals of the test-mode control unit 81 illustrated in FIG. 12 when switching a test operation mode. FIGS. 17A to 17C illustrate signal waveforms in test operation modes when switching test operation modes.

When a signal at a high level is applied to the IF pad 25 illustrated in FIG. 12, the power of the semiconductor storage device 10A is turned on. As in the first embodiment, a signal at a high level applied to the IF pad 25 is output as the test control signals TEST1 to TEST3 from the test-mode control unit 81. The test control signal TEST4 is set to a low level when resetting a corresponding latch. In this case, as illustrated in FIG. 14, entering the test operation mode TEST-B is performed.

In the test operation mode TEST-B, as illustrated in FIG. 15, asynchronous write and read operations, asynchronous write and read operations in which an upper byte part is masked, and asynchronous write and read operations in which a lower byte part is masked are performed. As illustrated in FIG. 17A, in the write operations, the chip-enable signal /CE1, the signal WEint (=A09), and the output-enable signal /OE are set to a low level, a low level, and a high level, respectively. In the read operations, the chip-enable signal /CE1, the signal WEint (=A09), and the output-enable signal /OE are set to a low level, a high level, and a low level, respectively. When the masking is not performed, the data byte control signals /UB and /LB are set to a low level. When only an upper byte part is masked, the data byte control signals /UB and /LB are set to a high level and a low level, respectively. When only a low-order byte part is masked, the data byte control signals /UB and /LB are set to a low level and a high level, respectively.

In response to the states of these control signals, the timing control unit 11 illustrated in FIG. 10 writes and reads data to and from a designated address.

Then, as illustrated in FIG. 15, the test operation mode TEST-C is set. In order to switch a test operation mode, entering the test mode is performed. As illustrated in FIG. 16, the chip-enable signal /CE1, the write-enable signal /WE, and the output-enable signal /OE are set to a low level. In accordance with such settings, entering the test mode is performed, and the address signals A00 to A04 are read into the latches of the test-mode control unit 81 illustrated in FIG. 12. As illustrated in FIG. 16, in order to enter the test operation mode TEST-C, the address signals A00, A01, A02, A03, and A04 are set to a high level, a high level, a low level, a high level, and a high level, respectively. The latch output signals n00z and n01 to n03 of the test-mode control unit 81 correspond to address signals. The test control signals TEST1, TEST2, TEST3, and TEST4 are set to a high level, a low level, a high level, and a high level, respectively. As illustrated in FIG. 14, entering the test operation mode TEST-C is performed. FIG. 17B illustrates the waveforms of the control signals when a test operation mode is shifted from the test operation mode TEST-B to the test operation mode TEST-C.

As illustrated in FIG. 15, in the test operation mode TEST-C, synchronous write operation is performed. As illustrated in FIG. 17B, the chip-enable signal /CE1 and the output-enable signal /OE are set to a low level and a high level, respectively. In the test operation mode TEST-C, the signal WEint is set to a low level in accordance with a switch circuit operation. A clock signal (pulse train signal), which is alternately set to a high level and a low level, is applied to the address signal A09. Thus, as illustrated in FIG. 17B, the signal CLKint serves as a clock signal. In response to these control signals, the timing control unit 11 illustrated in FIG. 10 synchronous-writes input data to a designated address.

As illustrated in FIG. 15, in the test operation mode TEST-D, a synchronous read operation is performed. As illustrated in FIG. 17B, the chip-enable signal /CE1 and the output-enable signal /OE are set to a low level. In the test operation mode TEST-D, the signal WEint is set to a high level by a corresponding switch circuit. The address signal A09, which is applied from the outside and is alternately set to a high level and a low level, serves a clock signal (pulse train signal) CLKint (see FIG. 17B). In response to these control signals, the timing control unit 11 illustrated in FIG. 10 synchronous-reads input data from a designated address.

FIGS. 17B and 17C illustrate states where a synchronous write operation in which an upper byte part is masked, a synchronous read operation in which an upper byte part is masked, a synchronous write operation in which a lower byte part is masked, and a synchronous read operation in which a lower byte part is masked are performed, while the test operation mode TEST-C and the test operation mode TEST-D are set alternately. When only an upper byte part is masked, the data byte control signals /UB and /LB are set to a high level and a low level, respectively. When only a lower byte part is masked, the data byte control signals /UB and /LB are set to a low level and a high level, respectively.

The semiconductor storage device 10A illustrated in FIG. 10 performs various tests on synchronous write and read functions, asynchronous write and read functions, mask functions, and the like.

Example embodiments of the present invention have now been described in accordance with the above advantages. It will be appreciated that these examples are merely illustrative of the invention. Many variations and modifications will be apparent to those skilled in the art.

What is claimed is:

1. A method for manufacturing a semiconductor storage device, the method comprising:
    generating a test control signal based on one of a test command and a test signal;
    generating a first control signal for controlling the semiconductor storage device based on the test control signal and a first signal from an input-signal pad;
    generating a second control signal for controlling the semiconductor storage device based on a second signal from a control-signal pad; and
    testing the semiconductor storage device based on the first control signal and the second control signal to manufacture the semiconductor storage device.

2. The method for producing the semiconductor storage device according to claim 1, wherein the control-signal pad is at least one of a DQ-mask-signal pad, a clock-signal pad, a chip-enable-signal pad, a write-enable-signal pad, and an output-enable-signal pad.

3. The method for producing the semiconductor storage device according to claim 1, wherein at least one of a write operation of a data signal and a read operation of the data signal is performed while a portion of a bit sequence of the data signal is masked based on the first signal.

4. The method for producing the semiconductor storage device according to claim 1, wherein at least one of a clock synchronous test and a clock asynchronous test is performed, wherein a clock signal is supplied as the first signal in the clock synchronous test and a fixed signal is supplied as the second signal in the asynchronous test.

* * * * *